(12) United States Patent
Kimizuka

(10) Patent No.: US 12,349,441 B2
(45) Date of Patent: Jul. 1, 2025

(54) SEMICONDUCTOR DEVICE AND SEMICONDUCTOR DEVICE MANUFACTURING METHOD, AND IMAGE CAPTURING DEVICE

(71) Applicant: SONY SEMICONDUCTOR SOLUTIONS CORPORATION, Kanagawa (JP)

(72) Inventor: Naohiko Kimizuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 568 days.

(21) Appl. No.: 17/773,814

(22) PCT Filed: Sep. 25, 2020

(86) PCT No.: PCT/JP2020/036393
§ 371 (c)(1),
(2) Date: May 2, 2022

(87) PCT Pub. No.: WO2021/095374
PCT Pub. Date: May 20, 2021

(65) Prior Publication Data
US 2022/0384597 A1    Dec. 1, 2022

(30) Foreign Application Priority Data
Nov. 13, 2019  (JP) ................. 2019-205543

(51) Int. Cl.
*H01L 29/423*  (2006.01)
*H10D 64/01*  (2025.01)
(Continued)

(52) U.S. Cl.
CPC ........... *H10D 64/516* (2025.01); *H10D 64/01* (2025.01); *H10D 64/513* (2025.01);
(Continued)

(58) Field of Classification Search
CPC ....... H01L 29/42368; H01L 21/823412; H01L 21/823456; H01L 21/823462;
(Continued)

(56) References Cited

U.S. PATENT DOCUMENTS

2009/0173994 A1*  7/2009  Min .................... H01L 29/4983
                                                            438/270
2017/0018591 A1   1/2017  Yamaguchi
(Continued)

FOREIGN PATENT DOCUMENTS

JP    2006-121093    5/2006
JP    2017-027982    2/2017
(Continued)

OTHER PUBLICATIONS

International Search Report and Written Opinion prepared by the Japan Patent Office on Nov. 20, 2020, for International Application No. PCT/JP2020/036393, 2 pgs.

*Primary Examiner* — Mohammed R Alam
(74) *Attorney, Agent, or Firm* — SHERIDAN ROSS P.C.

(57) ABSTRACT

A semiconductor device, a semiconductor device manufacturing method, and an image capturing device capable of suppressing variations in transistor characteristics. The semiconductor device includes a semiconductor substrate, and a field effect transistor. The field effect transistor includes a semiconductor region having a channel, a gate electrode covering the semiconductor region, and a gate insulating film. The semiconductor region has a top face, and a first side face at one side of the top face in a gate width direction of the gate electrode. The gate electrode has a first part facing the top face over the gate insulating film, and a second part facing the first side face over the gate insulating film. A first end face of the first part and a second end face (Continued)

of the second part are flush at at least one end of the gate electrode in a gate length direction.

7 Claims, 53 Drawing Sheets

(51) Int. Cl.
    *H10D 64/27*     (2025.01)
    *H10D 84/01*     (2025.01)
    *H10D 84/03*     (2025.01)
    *H10D 84/83*     (2025.01)
    *H10F 39/00*     (2025.01)

(52) U.S. Cl.
    CPC ..... *H10D 84/0128* (2025.01); *H10D 84/0142* (2025.01); *H10D 84/0144* (2025.01); *H10D 84/038* (2025.01); *H10D 84/83* (2025.01); *H10F 39/014* (2025.01); *H10F 39/80373* (2025.01)

(58) Field of Classification Search
    CPC ............. H01L 27/088; H01L 27/14614; H01L 27/14689; H01L 29/401; H01L 29/4236; H01L 29/1037; H01L 29/66545; H01L 29/66659; H01L 29/78; H01L 21/823437; H01L 29/785; H01L 27/146; H01L 29/42356; H01L 27/14612; H01L 27/14643; H01L 29/42364; H01L 29/66477; H01L 27/14609; H01L 27/14683

See application file for complete search history.

(56) References Cited

U.S. PATENT DOCUMENTS

2019/0123079 A1\*   4/2019   Kudoh ................ H01L 29/4236
2021/0111276 A1\*   4/2021   Karmous ............ H01L 29/7396

FOREIGN PATENT DOCUMENTS

JP         2017-183636     10/2017
TW         201517276 A     5/2015

\* cited by examiner

SEMICONDUCTOR DEVICE AND SEMICONDUCTOR DEVICE MANUFACTURING METHOD, AND IMAGE CAPTURING DEVICE

CROSS REFERENCE TO RELATED APPLICATIONS

This application is a national stage application under 35 U.S.C. 371 and claims the benefit of PCT Application No. PCT/JP2020/036393, having an international filing date of 25 Sep. 2020, which designated the United States, which PCT application claimed the benefit of Japanese Patent Application No. 2019-205543, filed 13 Nov. 2019, the entire disclosures of each of which are incorporated herein by reference.

TECHNICAL FIELD

The present disclosure relates to a semiconductor device and a semiconductor device manufacturing method, and to an image capturing device.

BACKGROUND ART

A non-planar transistor is known as a semiconductor device used in Complementary Metal Oxide Semiconductor (CMOS) image sensors (see PTL 1, for example).

CITATION LIST

Patent Literature

[PTL 1]
JP 2006-121093 A

SUMMARY

Technical Problem

The gate electrode of the non-planar transistor disclosed in PTL 1 has a horizontal gate electrode and a vertical gate electrode connected to the horizontal gate electrode. The vertical gate electrode is formed by embedding a gate electrode material in a recess provided in the semiconductor substrate layer. The horizontal gate electrode is formed by etching the gate electrode material using a mask pattern. Because the shape and location of the vertical gate electrode depend on the recess, and the shape and location of the horizontal gate electrode and the recess depend on different mask patterns, misalignment may arise between the vertical gate electrode and the horizontal gate electrode.

The drain region (or source region) of a non-planar transistor is formed in a self-aligning manner by implanting ions in the horizontal gate electrode using a mask. As such, no misalignment arises between the horizontal gate electrode and the drain region (or the source region). However, the vertical gate electrode is not used as the mask for this ion implantation. Therefore, if misalignment arises between the horizontal gate electrode and the vertical gate electrode, the distance between the vertical gate electrode and the drain region (or the source region) may vary.

If the distance between the vertical gate electrode and the drain region (or the source region) varies, transistor characteristics such as the gate-drain capacitance (Cgd) may vary and result in a drop in the performance of the CMOS image sensor.

Having been achieved in light of such circumstances, an object of the present disclosure is to provide a semiconductor device, a semiconductor device manufacturing method, and an image capturing device capable of suppressing variations in transistor characteristics.

Solution to Problem

A semiconductor device according to one aspect of the present disclosure includes a semiconductor substrate, and a field effect transistor provided on a first main surface side of the semiconductor substrate. The field effect transistor includes a semiconductor region in which a channel is formed, a gate electrode covering the semiconductor region, and a gate insulating film disposed between the semiconductor region and the gate electrode. The semiconductor region has a top face, and a first side face located at one side of the top face in a gate width direction of the gate electrode. The gate electrode has a first part facing the top face over the gate insulating film, and a second part facing the first side face over the gate insulating film. A first end face of the first part and a second end face of the second part are flush at at least one end of the gate electrode in a gate length direction.

Through this, the position of the first end face of the first part and the position of the second end face of the second part can be aligned at one end of the gate electrode in the gate length direction. Accordingly, the semiconductor device can suppress variations in the distance between a drain region (or source region) formed using the first part as a mask and the second part. As such, the semiconductor device can suppress variations in the transistor characteristics such as the gate-drain capacitance (Cgd).

A manufacturing method of a semiconductor device according to one aspect of the present disclosure is a manufacturing method of a semiconductor device including a field effect transistor on a first main surface of a semiconductor substrate, and includes: forming a first trench in a position adjacent to a semiconductor region by etching the first main surface side of the semiconductor substrate serving as a channel of the field effect transistor; forming a gate insulating film on a top face of the semiconductor region and a first side face facing the first trench in the semiconductor region; filling the first trench by forming an electrode member on the first main surface side on which the gate insulating film is formed; and forming a gate electrode by etching the electrode member. The gate electrode has a first part facing the top face over the gate insulating film, and a second part disposed in the first trench and facing the first side face over the gate insulating film. In the forming of the gate electrode, the electrode member is etched such that a first end face of the first part and a second end face of the second part are flush at at least one end of the gate electrode in the gate length direction.

Through this, the position of the first end face of the first part and the position of the second end face of the second part can be aligned at one end of the gate electrode in the gate length direction. As such, the above-described manufacturing method can manufacture a semiconductor device in which variations in the distance between the drain region (or source region) and the second part 32 are suppressed, and variations in the transistor characteristics such as Cgd are suppressed.

An image capturing device according to one aspect of the present disclosure includes a photoelectric conversion element and a semiconductor device for transmitting an electrical signal obtained through photoelectric conversion by the photoelectric conversion element. The semiconductor device includes a semiconductor substrate, and a field effect transistor provided on a first main surface side of the semiconductor substrate. The field effect transistor includes a semiconductor region in which a channel is formed, a gate electrode covering the semiconductor region, and a gate insulating film disposed between the semiconductor region and the gate electrode. The semiconductor region has a top face, and a first side face located at one side of the top face in a gate width direction of the gate electrode. The gate electrode has a first part facing the top face over the gate insulating film, and a second part facing the first side face over the gate insulating film. A first end face of the first part and a second end face of the second part are flush at at least one end of the gate electrode in a gate length direction.

Through this, the semiconductor device can suppress variations in the transistor characteristics such as the gate-drain capacitance (Cgd). By using the field effect transistor of the semiconductor device as an amplifying transistor that amplifies electrical signals, the image capturing device can suppress variations in charge conversion efficiency. Through this, the image capturing device can improve image capturing performance, such as by reducing fixed pattern noise, for example.

DESCRIPTION OF EMBODIMENTS

Embodiments of the present disclosure will be described hereinafter with reference to the drawings. In the descriptions of the drawings to be referred to hereinafter, the same or similar portions are denoted by the same or similar reference signs. However, it should be noted that the drawings are schematic and relationships between thicknesses and plan view dimensions, ratios of thicknesses of respective layers, and the like differ from those in reality. Therefore, specific thicknesses and dimensions should be determined by taking the following descriptions into consideration. In addition, it goes without saying that the drawings include portions where dimensional relationships and ratios differ between the drawings.

In addition, it is to be understood that definitions of directions such as up-down in the following descriptions are merely definitions provided for the sake of brevity and are not intended to limit the technical spirit of the present disclosure. For example, it is obvious that when an object is observed after being rotated by 90 degrees, up-down is converted into and interpreted as left-right, and when an object is observed after being rotated by 180 degrees, up-down is interpreted as being inverted.

In the following descriptions, the terms "X-axis direction", "Y-axis direction", and "Z-axis direction" may be used to describe directions. For example, the X-axis direction and the Y-axis direction are directions parallel to a front surface 10a of a semiconductor substrate 10. The X-axis direction is a gate length direction of a gate electrode 30, and the Y-axis direction is a gate width direction of the gate electrode 30. The X-axis direction and the Y-axis direction are also referred to as "horizontal directions". The Z-axis direction is a direction which intersects vertically with the front surface 10a of the semiconductor substrate 10. The X-axis direction, the Y-axis direction, and the Z-axis direction are directions orthogonal to each other.

The following descriptions give a case where a first conductivity type is N-type and a second conductivity type is P-type as an example. However, the conductivity types may be selected in an inverse relationship, with the first conductivity type being P-type and the second conductivity type being N-type.

First Embodiment (Example of Configuration of Image Capturing Device)

Figure 1:
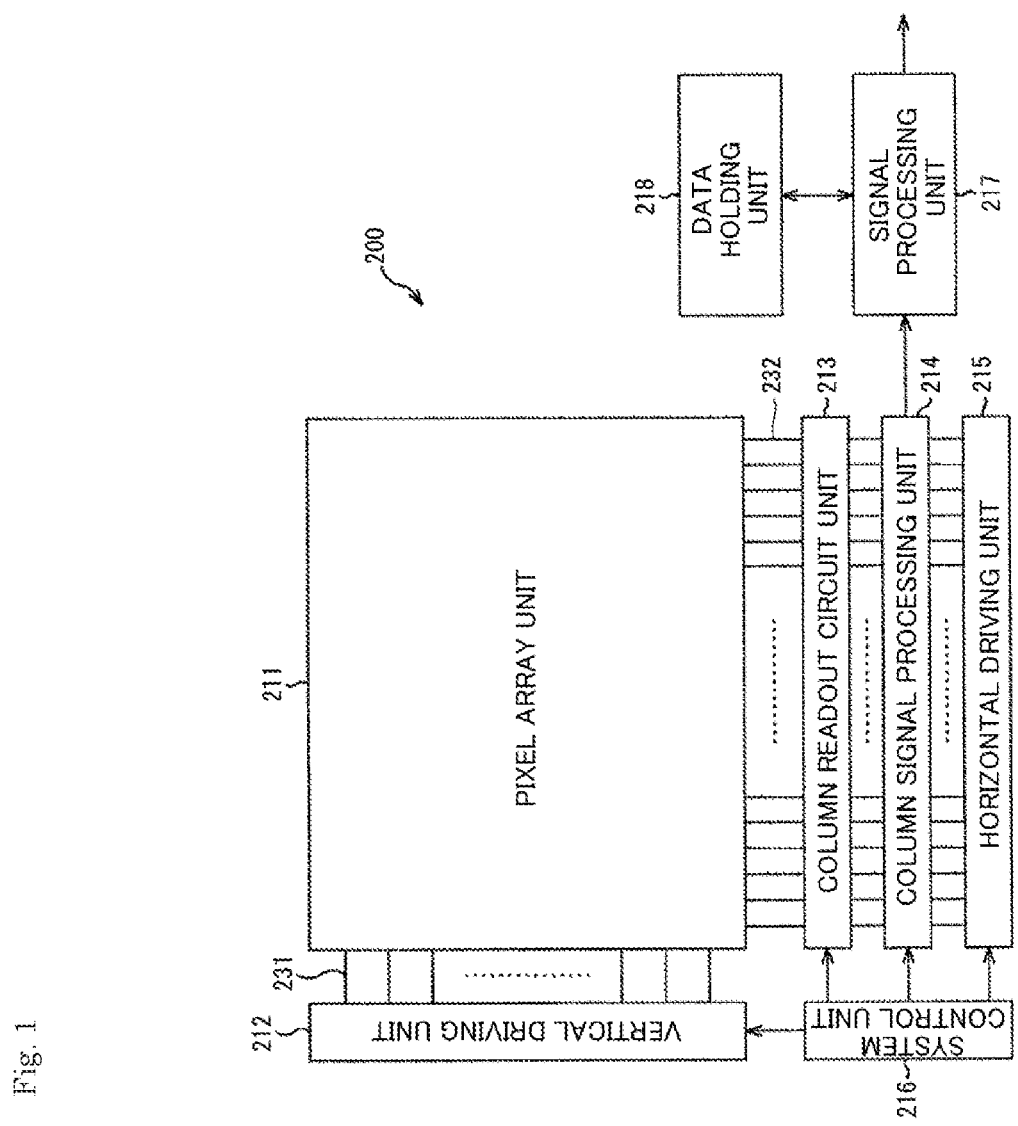
FIG. 1 is a diagram illustrating an example of the configuration of an image capturing device according to a first embodiment of the present disclosure.

FIG. 1 is a diagram illustrating an example of the configuration of an image capturing device 200 according to a first embodiment of the present disclosure. As illustrated in FIG. 1, the image capturing device 200 is an image sensor using a Complementary Metal Oxide Semiconductor (CMOS), for example ("CMOS image sensor" hereinafter). The image capturing device 200 takes in incident light (image light) from a subject through an optical lens system (not shown), converts the light intensity of the incident light formed on an image capturing plane into electrical signals on a pixel-by-pixel basis, and outputs the results as pixel signals.

In FIG. 1, the image capturing device 200 includes a pixel array unit 211, a vertical driving unit 212, a column readout circuit unit 213, a column signal processing unit 214, a horizontal driving unit 215, a system control unit 216, a signal processing unit 217, and a data holding unit 218.

The pixel array unit 211, the vertical driving unit 212, the column readout circuit unit 213, the column signal processing unit 214, the horizontal driving unit 215, the system control unit 216, the signal processing unit 217, and the data holding unit 218 are formed on the same semiconductor substrate (chip) or on a plurality of stacked semiconductor substrates which are electrically connected. Pixels are arranged two-dimensionally in matrix form in the pixel array unit 211. Each pixel has a photodiode capable of photoelectrically converting and internally accumulating a charge amount according to an incident light intensity and outputting the result as an electrical signal (an example of a "photoelectric conversion element" of the present disclosure).

In addition to pixels that are active ("active pixels" hereinafter), the pixel array unit 211 may include dummy pixels having a structure which lacks a photodiode, regions where light-blocking pixels having a structure that blocks the light-receiving surface and blocks light entering from the outside are arranged two-dimensionally in matrix form, and the like.

Furthermore, in the pixel array unit 211, for the matrix of pixel arrays, a pixel drive line 231 is formed for each row in the lateral direction in the drawing (the direction in which the pixels are arranged in a pixel row), and a vertical pixel wire 232 is formed for each column in a longitudinal direction in the drawing (the direction in which the pixels are arranged in a pixel column). One end of each pixel drive line 231 is connected to an output end corresponding to each row of the vertical driving unit 212.

The column readout circuit unit 213 includes a circuit that supplies a constant current to the pixels in a selected row in the pixel array unit 211 for each column, a current mirror circuit that constitutes a high-gain amplifier, and a readout mode change switch. The column readout circuit unit 213 constitutes an amplifier along with a transistor in a selected pixel in the pixel array unit 211, converts a charge signal into a voltage signal, and outputs the voltage signal to the vertical pixel wire 232.

The vertical driving unit 212 is a pixel driving unit that drives each pixel in the pixel array unit 211, simultaneously, in units of rows, or the like. The vertical driving unit 212 is constituted by a shift register, an address decoder, or the like.

A pixel signal output from each pixel in a pixel row selected and scanned by the vertical driving unit 212 is supplied to the column signal processing unit 214 through each of the vertical pixel wires 232. The column signal processing unit 214 performs predetermined signal processing on the pixel signals output from the pixels in the selected row through the vertical pixel wire 232 for each pixel column of the pixel array unit 211, and temporarily holds the pixel signals after the signal processing.

The horizontal driving unit 215 selects unit circuits, which correspond to the pixel columns of the column signal processing unit 214, in order. By the selection and scanning performed by the horizontal driving unit 215, pixel signals processed by the column signal processing unit 214 are sequentially output to the signal processing unit 217. The horizontal driving unit 215 is constituted by a shift register, an address decoder, or the like.

The system control unit 216 is constituted by a timing generator that generates various timing signals, and the like. The system control unit 216 controls the driving of the vertical driving unit 212, the column signal processing unit 214, the horizontal driving unit 215, and the like on the basis of the various timing signals generated by the timing generator.

The image capturing device 200 further includes the signal processing unit 217 and the data holding unit 218. The signal processing unit 217 performs various types of signal processing on the pixel signals output from the column signal processing unit 214, such as adding processing and the like. The data holding unit 218 temporarily stores data necessary for the signal processing by the signal processing unit 217. The signal processing unit 217 and the data holding unit 218 may be provided in an external signal processing unit provided on a substrate separate from the image capturing device 200, e.g., a Digital Signal Processor (DSP), or may be processing realized by software. The signal processing unit 217 and the data holding unit 218 may, however, be provided on the same substrate as the image capturing device 200 (e.g., the semiconductor substrate 10, which will be described later).

(Example of Configuration of Pixel)

Figure 2:
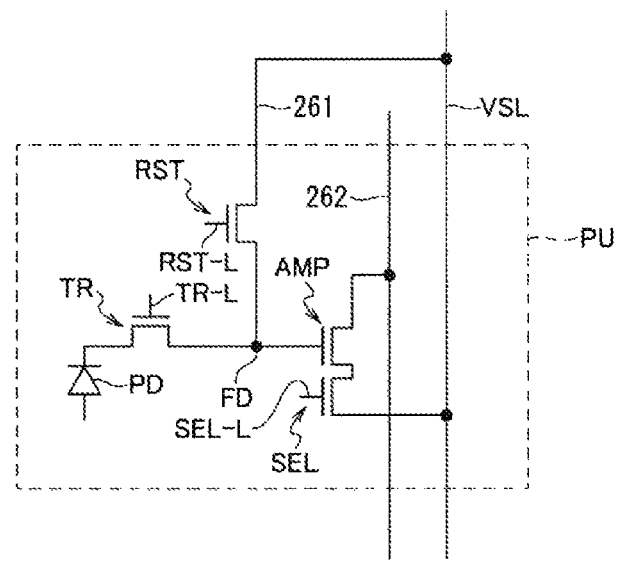
FIG. 2 is a circuit diagram illustrating an example of the configuration of a pixel according to the first embodiment of the present disclosure.

An example of the circuit configuration of the pixels arranged two-dimensionally in matrix form in the pixel array unit 211 will be described next. FIG. 2 is a circuit diagram illustrating an example of the configuration of a pixel PU according to the first embodiment of the present disclosure. As illustrated in FIG. 2, the pixel PU includes a photodiode PD, a transfer transistor TR, a reset transistor RST, an amplifying transistor AMP, and a selecting transistor SEL. The pixel PU also includes a floating diffusion region FD.

The anode of the photodiode PD is grounded, and the cathode of the photodiode is connected to the source of the transfer transistor TR. The drain of the transfer transistor TR is connected to the source of the reset transistor RST and the gate of the amplifying transistor AMP, and that connection point constitutes the floating diffusion region FD.

The drain of the reset transistor RST is connected to a vertical reset input line 261, and the source of the amplifying transistor AMP is connected to a vertical current supply line 262. The drain of the amplifying transistor AMP is connected to the source of the selecting transistor SEL, and the drain of the selecting transistor SEL is connected to a vertical signal line VSL. The vertical reset input line 261, the vertical current supply line 262, and the vertical signal line VSL are each part of the vertical pixel wire 232 (see FIG. 1).

The gates of the transfer transistor TR, the reset transistor RST, and the selecting transistor SEL are connected to the vertical driving unit 212 (see FIG. 1) by driving lines TR-L, RST-L, and SEL-L, respectively, and pulses are supplied thereto as drive signals. The driving lines TR-L, RST-L, and SEL-L are part of the pixel drive line 231 (see FIG. 1).

(Example of Configuration of Differential Pixel Readout Circuit)

Figure 3:
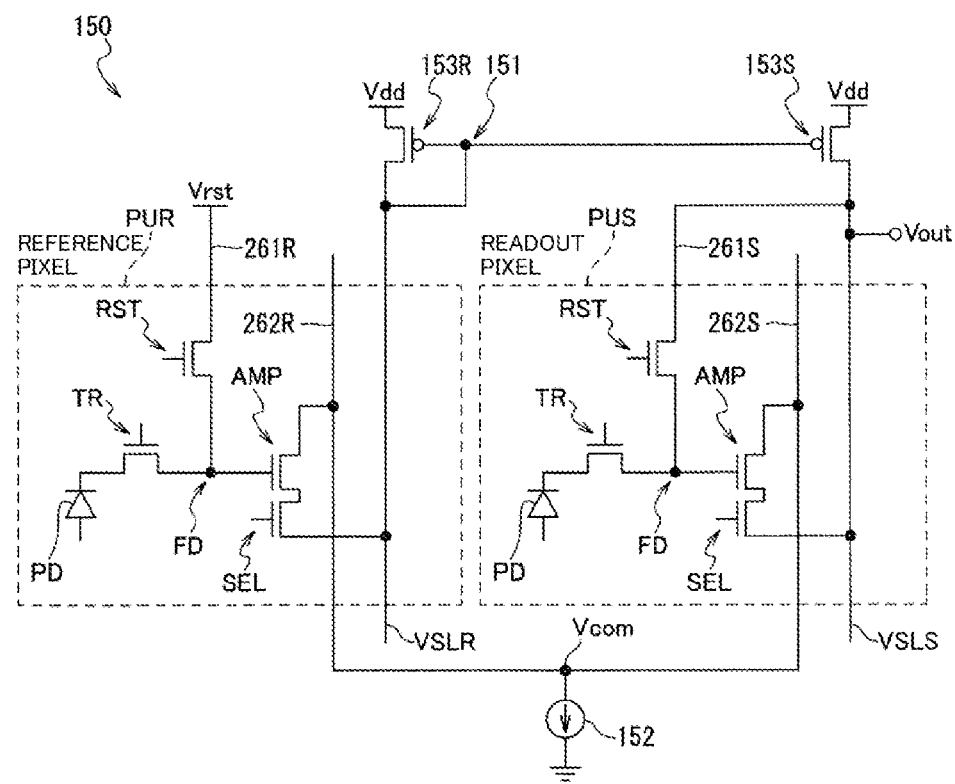
FIG. 3 is a circuit diagram illustrating an example of the configuration of a differential readout circuit according to the first embodiment of the present disclosure.

FIG. 3 is a circuit diagram illustrating an example of the configuration of a differential readout circuit 150 according to the first embodiment of the present disclosure. As illustrated in FIG. 3, the differential readout circuit 150 includes a readout pixel PUS that reads out the charge signal, a reference pixel PUR that provides a reference voltage without a charge signal, a current mirror circuit 151 constituted by a PMOS transistor, and a load MOS circuit 152 that supplies a constant current to the pixel. The readout pixel PUS and the reference pixel PUR have the same configuration as the pixel PU illustrated in FIG. 2.

In the readout pixel PUS, the drain of the reset transistor RST is connected to a readout-side vertical reset input line 261S. The source of the amplifying transistor AMP is connected to a readout-side vertical current supply line 262S. The drain of the amplifying transistor AMP is connected to the source of the selecting transistor SEL. The drain of the selecting transistor SEL is connected to a readout-side vertical signal line VSLS.

In the readout pixel PUS, the gates of the transfer transistor TR, the reset transistor RST, and the selecting transistor SEL are connected to the vertical driving unit 212 (see FIG. 1) by the pixel drive line 231 (see FIG. 1). Drive signals for readout are supplied from the vertical driving unit 212 to the gates of the transfer transistor TR, the reset transistor RST, and the selecting transistor SEL over the pixel drive line 231.

The readout-side vertical signal line VSLS is connected to the readout-side vertical reset input line 261S, the drain of a readout-side PMOS transistor 153S included in the current mirror circuit 151, and an output terminal Vout of the differential readout circuit 150. When a readout-side reset transistor RST is on, the vertical reset input line 261S is connected to the floating diffusion region FD, and an output signal from the readout circuit 150 is negatively fed back.

In the reference pixel PUR, the drain of the reset transistor RST is connected to a reference-side vertical reset input line 261R. The source of the amplifying transistor AMP is connected to a reference-side vertical current supply line 262R. The drain of the amplifying transistor AMP is connected to the source of the selecting transistor SEL. The drain of the selecting transistor SEL is connected to a reference-side vertical signal line VSLR.

In the reference pixel PUR, the vertical driving unit 212 (see FIG. 1) is connected to the gates of the transfer transistor TR, the reset transistor RST, and the selecting transistor SEL by the pixel drive line 231 (see FIG. 1). Drive signals for reference are supplied from the vertical driving unit 212 to the gates of the transfer transistor TR, the reset transistor RST, and the selecting transistor SEL over the pixel drive line 231.

The reference-side vertical signal line VSLR is connected to the drain and the gate of a reference-side PMOS transistor 153R included in the current mirror circuit 151, and to the gate of the readout-side PMOS transistor 153S.

The reference-side vertical reset input line 261R is connected to a power supply Vrst. During resets, a desired input voltage signal is applied, through the vertical reset input line 261R, to the input terminal of the amplifying transistor AMP of the selected reference pixel PUR.

The readout-side vertical current supply line 262S and the reference-side vertical current supply line 262R are connected to the load MOS circuit 152, which is a constant current source, after being connected to each other at a connection point Vcom. In the differential readout circuit 150, the amplifying transistor AMP of the readout pixel PUS and the amplifying transistor AMP of the reference pixel PUR constitute a differential amplifier (differential amplifier circuit), and a voltage signal based on a charge signal detected by the photodiode PD of the readout pixel PUS is output through the output terminal Vout.

(Example of Configuration of Semiconductor Device)

Figure 4A:
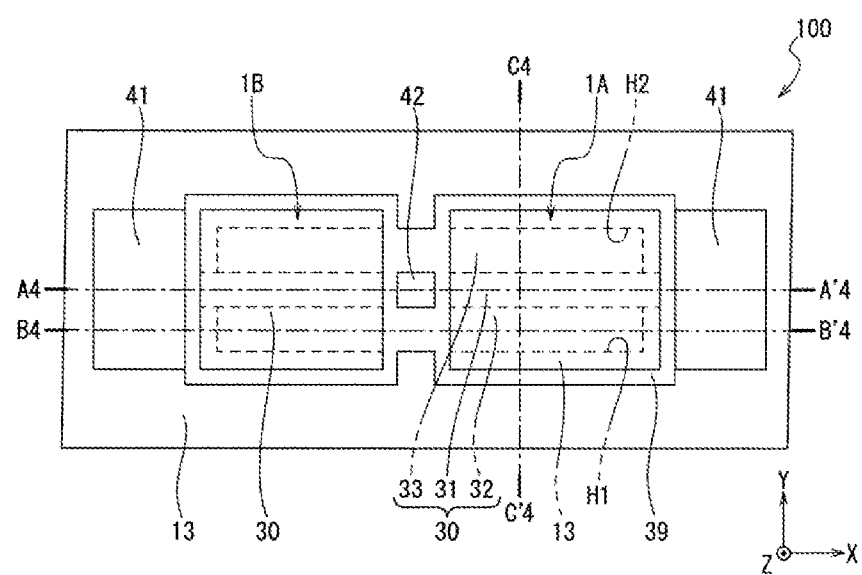
FIG. 4A is a plan view illustrating an example of the configuration of a semiconductor device according to the first embodiment of the present disclosure.
Figure 4B:
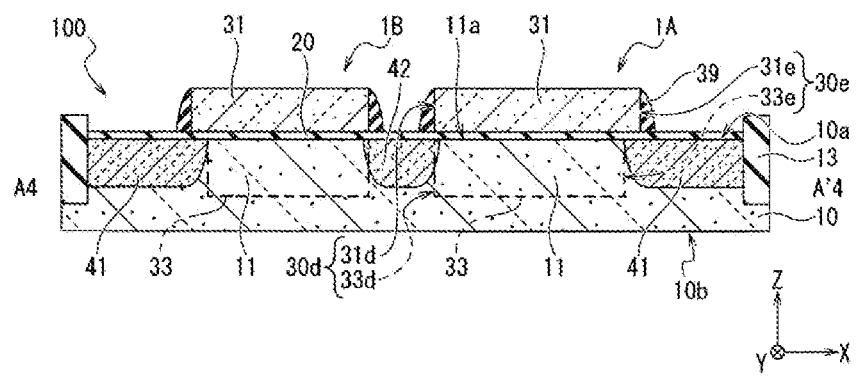
FIG. 4B is a cross-sectional view illustrating an example of the configuration of the semiconductor device according to the first embodiment of the present disclosure.
Figure 4C:
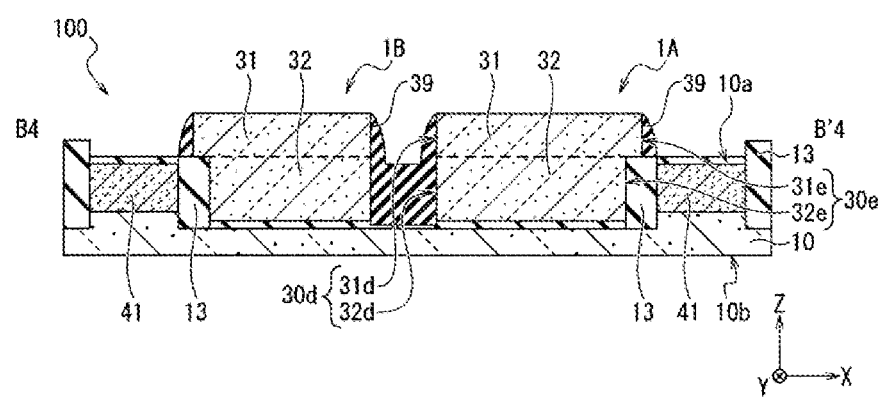
FIG. 4C is a cross-sectional view illustrating an example of the configuration of the semiconductor device according to the first embodiment of the present disclosure.
Figure 4D:
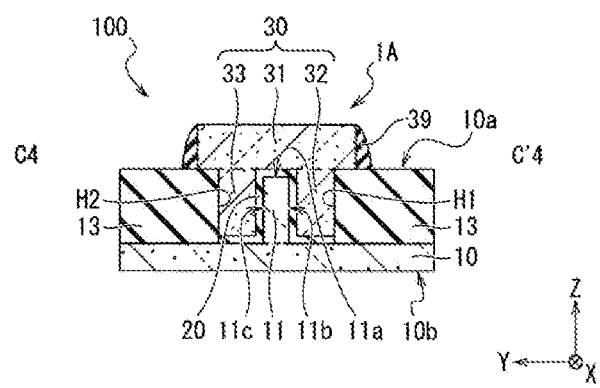
FIG. 4D is a cross-sectional view illustrating an example of the configuration of the semiconductor device according to the first embodiment of the present disclosure.

A semiconductor device constituting the pixel array unit 211 illustrated in FIG. 1 will be described next. FIG. 4A is a plan view illustrating an example of the configuration of a semiconductor device 100 according to the first embodiment of the present disclosure. FIGS. 4B to 4D are cross-sectional views illustrating an example of the configuration of the semiconductor device 100 according to the first embodiment of the present disclosure. Specifically, FIG. 4B illustrates a cross-section of the plan view illustrated in FIG. 4A, cut along a line A4-A'4 parallel to the X-axis. FIG. 4C illustrates a cross-section of the plan view illustrated in FIG. 4A, cut along a line B4-B'4 parallel to the X-axis. FIG. 4D illustrates a cross-section of the plan view illustrated in FIG. 4A, cut along a line C4-C'4 parallel to the Y-axis.

As illustrated in FIGS. 4A to 4D, the semiconductor device 100 includes the semiconductor substrate 10, a plurality of Metal Oxide Semiconductor (MOS) transistors 1A and 1B (an example of a "field effect transistor" of the present disclosure) provided on the semiconductor substrate 10, and an element separation layer 13 provided on the semiconductor substrate 10.

The semiconductor substrate 10 is constituted by, for example, single-crystal silicon. The semiconductor substrate 10 has the front surface 10a (an example of a "first main surface" of the present disclosure), and a rear surface 10b located on the side opposite from the front surface 10a. The MOS transistors 1A and 1B are provided on the front surface 10a side of the semiconductor substrate 10. The element separation layer 13 is an insulating film for electrically separating elements adjacent in the horizontal direction parallel to the front surface 10a, and is constituted by, for example, a silicon oxide film ($SiO_2$ film).

The MOS transistors 1A and 1B are transistors of a first conductivity type (e.g., N-type). For example, the MOS transistor 1A is the amplifying transistor AMP (see FIGS. 2 and 3), and the MOS transistor 1B is the selecting transistor SEL (see FIGS. 2 and 3). The MOS transistors 1A and 1B are connected to each other in series.

The MOS transistors 1A and 1B each include a second conductivity type (e.g., P-type) semiconductor region 11 in which a channel is formed, a gate insulating film 20, the gate electrode 30, a sidewall 39, and second conductivity type impurity diffusion layers 41 and 42 provided on the semiconductor substrate 10.

One of the impurity diffusion layers 41 and 42 is a source region, and the other is a drain region. For example, in the MOS transistor 1A, the impurity diffusion layer 41 is the source region, and the impurity diffusion layer 42 is the drain region. In the MOS transistor 1B, the impurity diffusion layer 41 is the drain region, and the impurity diffusion layer 42 is the source region. FIG. 4B illustrates an example of how the MOS transistors 1A and 1B share the impurity diffusion layer 42.

The semiconductor region 11 is, for example, part of the semiconductor substrate 10, and is constituted by single-crystal silicon. The semiconductor region 11 is a part which is formed by etching part of the front surface 10a side of the semiconductor substrate 10, and has a fin shape, for example.

The semiconductor region 11 has a shape that is longer in the X-axis direction and shorter in the Y-axis direction. For example, the length of the semiconductor region 11 in the X-axis direction is at least 150 nm and at most 700 nm. The length of the semiconductor region 11 in the Y-axis direction (the width) is at least 15 nm and at most 1000 nm. The length of the semiconductor region 11 in the Z-axis direction (the depth) is at least 100 nm and at most 1000 nm.

In the Y-axis direction, a trench H1 (an example of a "first trench" of the present disclosure) is provided at one side of the semiconductor region 11, and a trench H2 (an example of a "second trench" of the present disclosure) is provided at the other side of the semiconductor region 11. A second part 32 of the gate electrode 30 is disposed in the trench H1. A third part 33 of the gate electrode 30 is disposed in the trench H2. The second part 32 and the third part 33 will be described later. The semiconductor region 11 is interposed, in the Y-axis direction, between the second part 32 disposed in the trench H1 and the third part 33 disposed in the trench H2.

The gate insulating film 20 is provided so as to cover a top face 11a, a first side face 11b, and a second side face 11c of the semiconductor region 11. The top face 11a of the semiconductor region 11 is part of the front surface 10a of the semiconductor substrate 10. The first side face 11b is located at one side of the top face 11a in the Y-axis direction. The second side face 11c is located at the other side of the top face 11a in the Y-axis direction. The gate insulating film 20 is constituted by, for example, $SiO_2$ film.

The gate electrode 30 covers the semiconductor region 11 over the gate insulating film 20. For example, the gate electrode 30 has a first part 31, which faces the top face 11a of the semiconductor region 11 over the gate insulating film 20; a second part 32, which faces the first side face 11b of the semiconductor region 11 over the gate insulating film 20; and the third part 33, which faces the second side face 11c of the semiconductor region 11 over the gate insulating film 20. The second part 32 and the third part 33 are connected to a bottom face of the first part 31. Note that the first part 31 may be called a "horizontal gate electrode". The second part 32 and the third part 33 may each be called a "vertical gate electrode".

Through this, the gate electrode 30 can simultaneously apply a gate voltage to the top face 11a, the first side face 11b, and the second side face 11c of the semiconductor region 11. In other words, the gate electrode 30 can simultaneously apply a gate voltage to the semiconductor region 11 from above, the left, and the right, for a total of three directions. This makes it possible for the gate electrode 30 to completely deplete the semiconductor region 11. The gate electrode 30 is constituted by, for example, polysilicon (Poly-Si) film.

The sidewall 39 is provided around the gate electrode 30. The sidewall 39 is constituted by, for example, silicon nitride film (SiN).

The impurity diffusion layers 41 and 42 are provided on and near the front surface 10a of the semiconductor substrate 10, respectively. In the X-axis direction, the impurity diffusion layer 41 connects to one side of the semiconductor region 11, and the impurity diffusion layer 42 connects to the other side of the semiconductor region 11. The impurity diffusion layers 41 and 42 are both of the first conductivity type (e.g., N-type).

The second part 32 and the third part 33 of the gate electrode 30 are disposed in the trenches H1 and H2, and thus the MOS transistor 1A according to the embodiment of the present disclosure may be called a grooved-gate structure MOS transistor. Or, the semiconductor region 11 has a fin shape, and thus the MOS transistor 1A may be called a "FinFET" (Fin Field Effect Transistor). Further still, the MOS transistor 1A has both the above shapes, and may therefore be called a "grooved FinFET". Likewise, the MOS transistor 1B may be called a grooved-gate structure MOS transistor, a FinFET, or a grooved FinFET.

In each of the MOS transistors 1A and 1B, the gate electrode 30 has an end face 30d at one end in the X-axis direction (e.g., the impurity diffusion layer 42 side), and an end face 30e at the other end in the X-axis direction (e.g., the impurity diffusion layer 41 side). The end face 30d includes an end face 31d of the first part 31 (an example of a "first end face" of the present disclosure), an end face 32d of the second part 32 (an example of a "second end face" of the present disclosure), and an end face 33d of the third part 33 (an example of a "third end face" of the present disclosure).

The end face 30e includes an end face 31e of the first part 31, an end face 32e of the second part 32, and an end face 33e of the third part 33.

In the semiconductor device 100 according to the first embodiment, there are no steps (or almost no steps) between the end face 31d and the end face 32d and between the end face 31d and the end face 33d. The end faces 31d, 32d, and 33d are flush. On the other hand, there are steps between the end face 31e and the end face 32e, and between the end face 31e and the end face 33e. The end faces 31e, 32e, and 33e are not flush.

(Semiconductor Device Manufacturing Method)

A manufacturing method for the semiconductor device 100 according to the first embodiment of the present disclosure will be described next. The semiconductor device 100 is manufactured using various types of devices, such as a film deposition device (including chemical vapor deposition (CVD) devices, thermal oxidation furnaces, sputtering devices, and resist application devices), exposure devices, ion implantation devices, annealing devices, etching devices, chemical mechanical polishing (CMP) devices, and the like. These devices will be collectively referred to as a "manufacturing device" hereinafter.

FIGS. 5A to 12C are diagrams illustrating the manufacturing method of the semiconductor device 100 according to the first embodiment of the present disclosure, in order of steps. In FIGS. 5A to 12C, the "A" drawings are plan views, the "B" drawings are cross-sectional views cut along a line A-A in the "A" drawings, and the "C" drawings are cross-sectional views cut along a line B-B' in the "A" drawings.

Figure 5A:
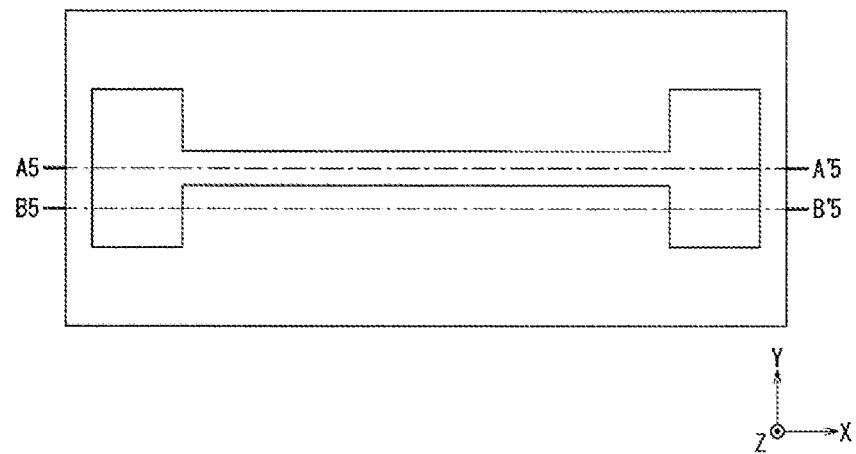
FIG. 5A is a diagram illustrating a manufacturing method of the semiconductor device according to the first embodiment of the present disclosure, in order of steps.
Figure 5B:
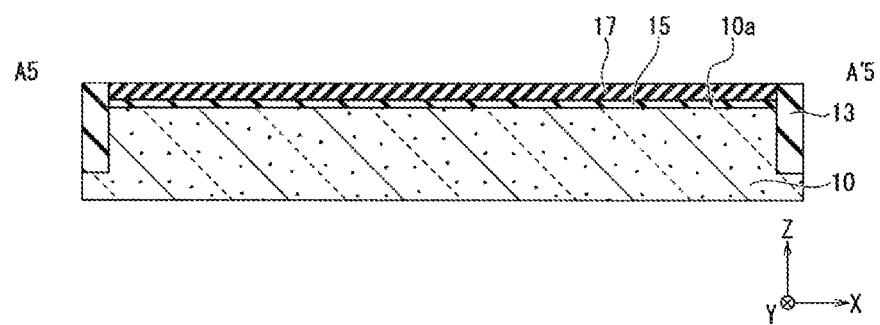
FIG. 5B is a diagram illustrating the manufacturing method of the semiconductor device according to the first embodiment of the present disclosure, in order of steps.
Figure 5C:
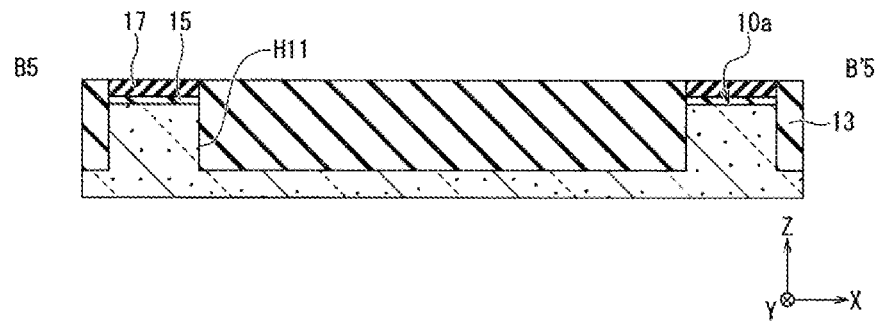
FIG. 5C is a diagram illustrating the manufacturing method of the semiconductor device according to the first embodiment of the present disclosure, in order of steps.

In FIGS. 5A to 5C, the manufacturing device forms a silicon oxide film ($SiO_2$ film) 15 and a silicon nitride film (SiN film) 17 in that order on the front surface 10a of the semiconductor substrate 10 using CVD. Next, the manufacturing device partially removes the silicon nitride film 17, the silicon oxide film 15, and the semiconductor substrate 10 in a groove region using photolithography and etching techniques. Through this, the manufacturing device forms a trench H11 in the groove region.

Next, the manufacturing device forms a silicon oxide film above the semiconductor substrate 10 using CVD to fill the trench H11. Next, the manufacturing device planarizes the silicon oxide film through CMP processing. In this CMP processing, the silicon nitride film 17 functions as a polishing stop layer. The element separation layer 13 is formed from the silicon oxide film as a result.

Figure 6A:
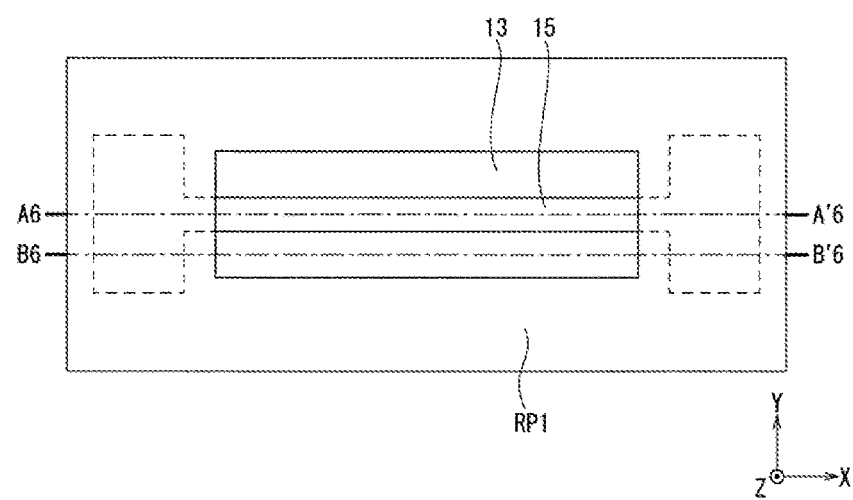
FIG. 6A is a diagram illustrating the manufacturing method of the semiconductor device according to the first embodiment of the present disclosure, in order of steps.
Figure 6B:
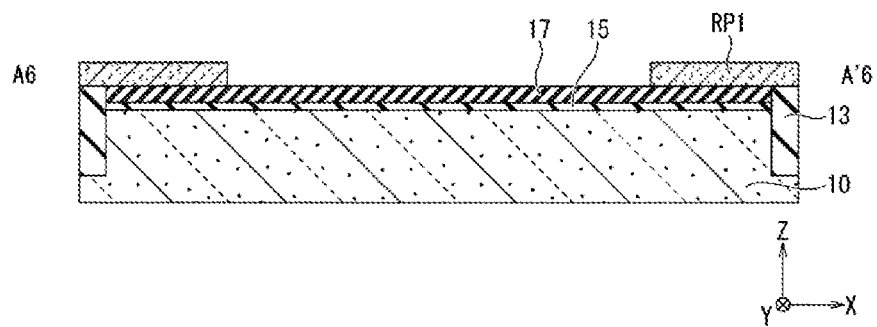
FIG. 6B is a diagram illustrating the manufacturing method of the semiconductor device according to the first embodiment of the present disclosure, in order of steps.
Figure 6C:
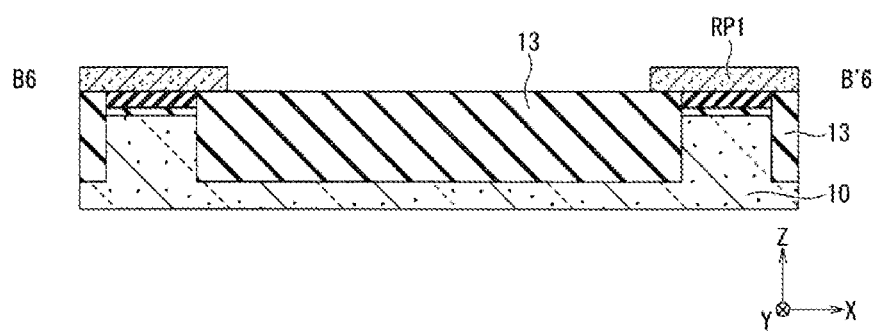
FIG. 6C is a diagram illustrating the manufacturing method of the semiconductor device according to the first embodiment of the present disclosure, in order of steps.
Figure 7A:
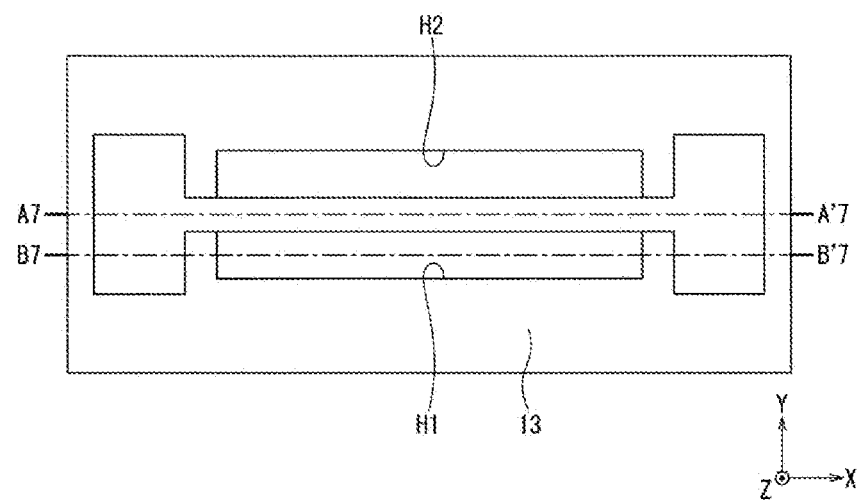
FIG. 7A is a diagram illustrating the manufacturing method of the semiconductor device according to the first embodiment of the present disclosure, in order of steps.
Figure 7B:
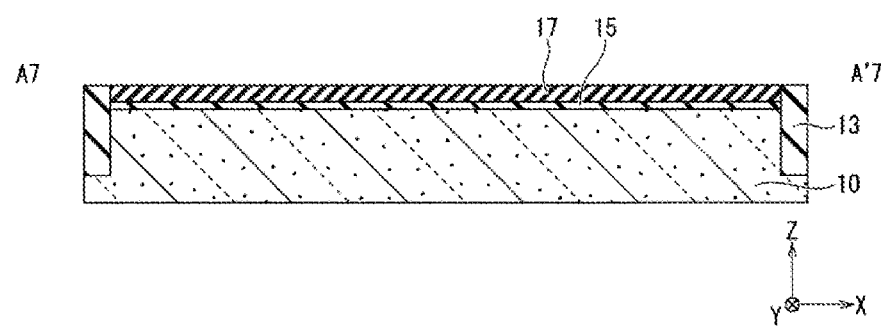
FIG. 7B is a diagram illustrating the manufacturing method of the semiconductor device according to the first embodiment of the present disclosure, in order of steps.
Figure 7C:
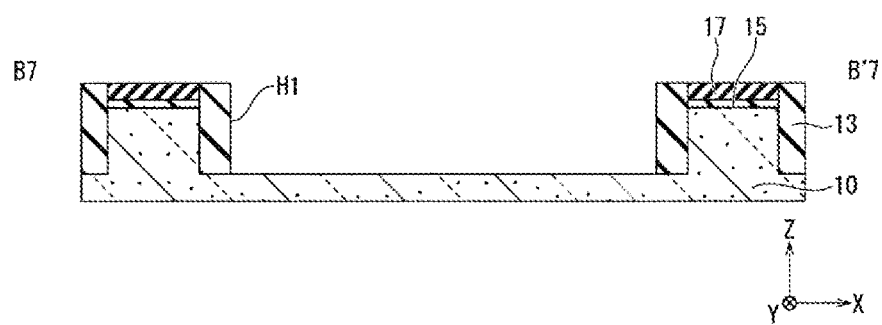
FIG. 7C is a diagram illustrating the manufacturing method of the semiconductor device according to the first embodiment of the present disclosure, in order of steps.

Next, as illustrated in FIGS. 6A to 6C, the manufacturing device forms a resist pattern RP1 above the semiconductor substrate 10. The resist pattern RP1 has a shape that is open in a region where the trenches H1 and H2 are formed (see FIG. 4D) and a region interposed between the trenches H1 and H2, and that covers the rest of the regions. Next, the manufacturing device removes the element separation layer 13 through etching, using the resist pattern RP1 and the silicon nitride film 17 as a mask. The trenches H1 and H2 are formed as a result, as illustrated in FIGS. 7A to 7C. The manufacturing device then removes the resist pattern RP1.

Figure 8A:
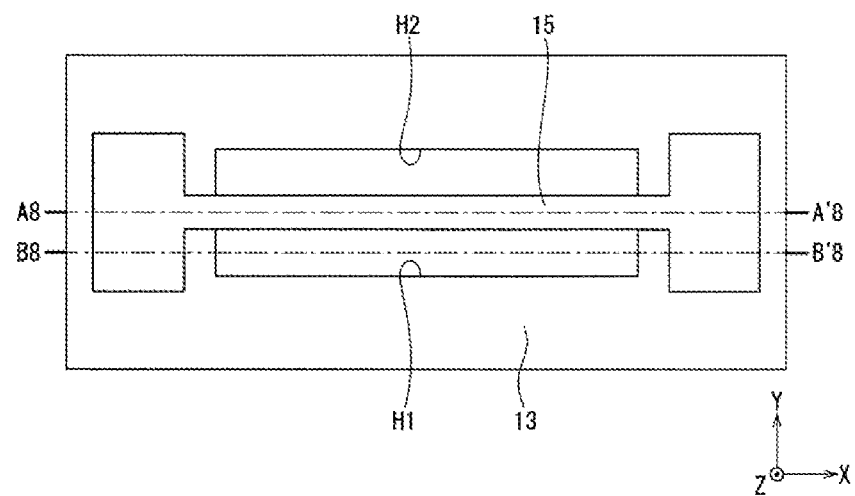
FIG. 8A is a diagram illustrating the manufacturing method of the semiconductor device according to the first embodiment of the present disclosure, in order of steps.
Figure 8B:
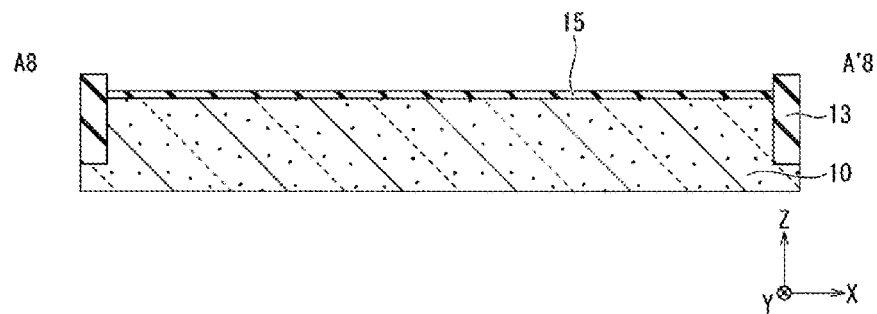
FIG. 8B is a diagram illustrating the manufacturing method of the semiconductor device according to the first embodiment of the present disclosure, in order of steps.
Figure 8C:
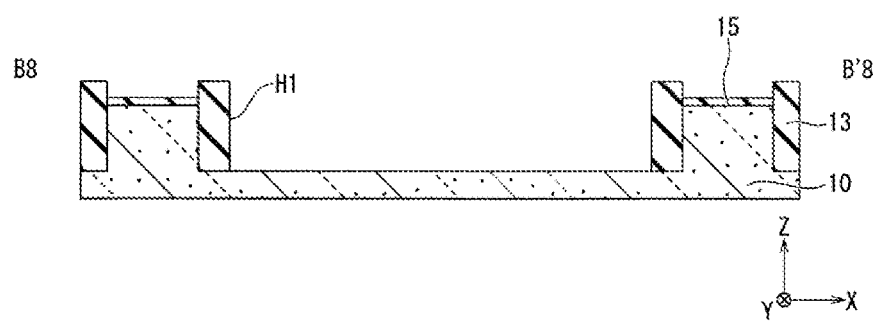
FIG. 8C is a diagram illustrating the manufacturing method of the semiconductor device according to the first embodiment of the present disclosure, in order of steps.

Next, as illustrated in FIGS. 8A to 8C, the manufacturing device removes the silicon nitride film 17. In the step of removing the silicon nitride film 17, the silicon oxide film 15 functions as an etching stop layer. Next, the manufacturing device removes the silicon oxide film 15. Through this, the front surface 10a of the semiconductor substrate 10 is exposed from under the silicon oxide film 15.

Figure 9A:
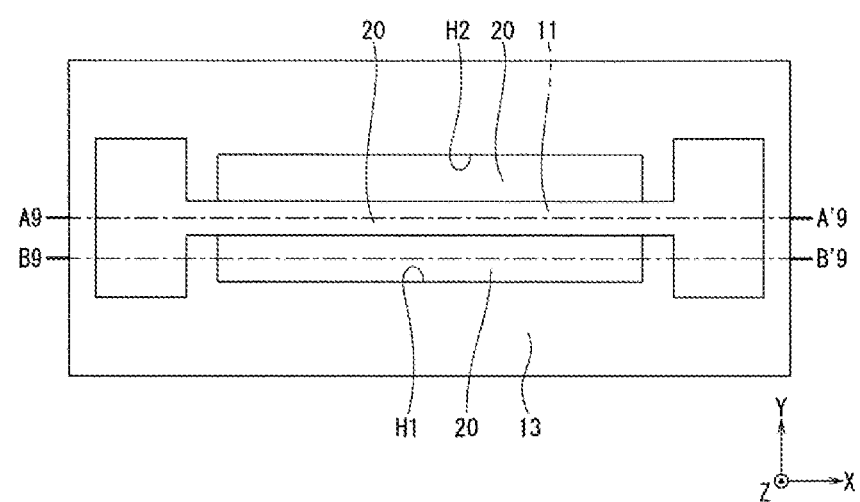
FIG. 9A is a diagram illustrating the manufacturing method of the semiconductor device according to the first embodiment of the present disclosure, in order of steps.
Figure 9B:
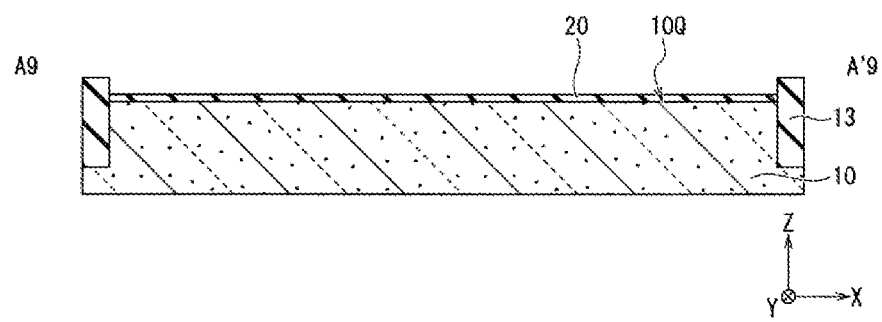
FIG. 9B is a diagram illustrating the manufacturing method of the semiconductor device according to the first embodiment of the present disclosure, in order of steps.
Figure 9C:
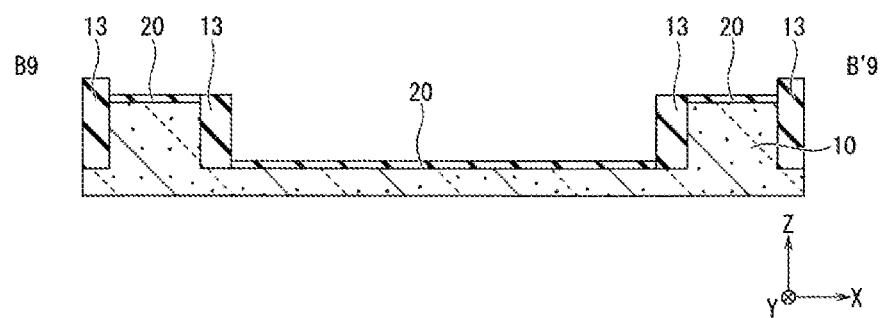
FIG. 9C is a diagram illustrating the manufacturing method of the semiconductor device according to the first embodiment of the present disclosure, in order of steps.

Next, the manufacturing device thermally oxidizes the semiconductor substrate 10. Through this, the gate insulating film 20 is formed on the front surface 10a of the semiconductor substrate 10, as illustrated in FIGS. 9A to 9C. The gate insulating film 20 is formed on the top face 11a, the first side face 11b, and the second side face 11c of the semiconductor region 11 interposed between the trenches H1 and H2.

Figure 10A:
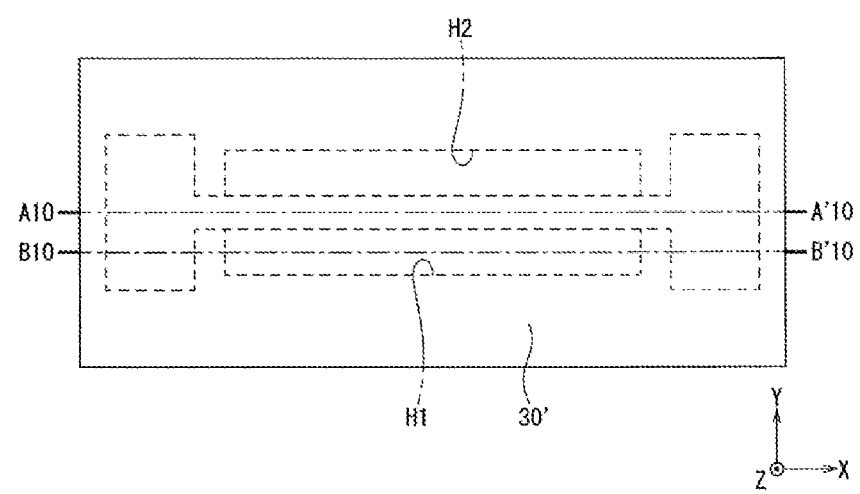
FIG. 10A is a diagram illustrating the manufacturing method of the semiconductor device according to the first embodiment of the present disclosure, in order of steps.
Figure 10B:
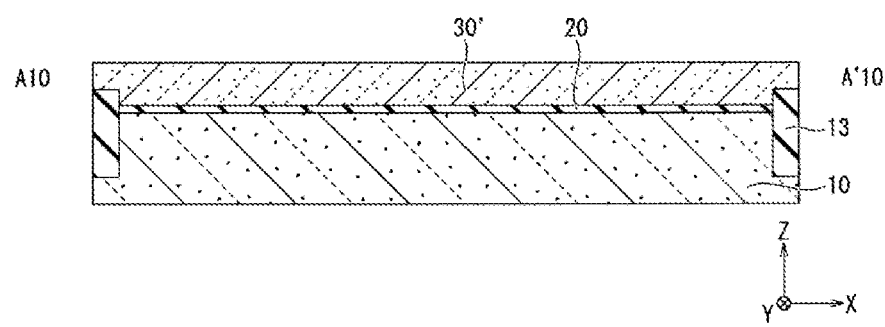
FIG. 10B is a diagram illustrating the manufacturing method of the semiconductor device according to the first embodiment of the present disclosure, in order of steps.
Figure 10C:
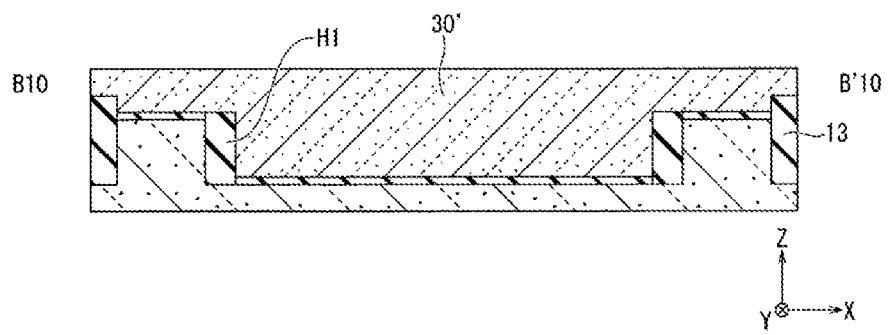
FIG. 10C is a diagram illustrating the manufacturing method of the semiconductor device according to the first embodiment of the present disclosure, in order of steps.
Figure 11A:
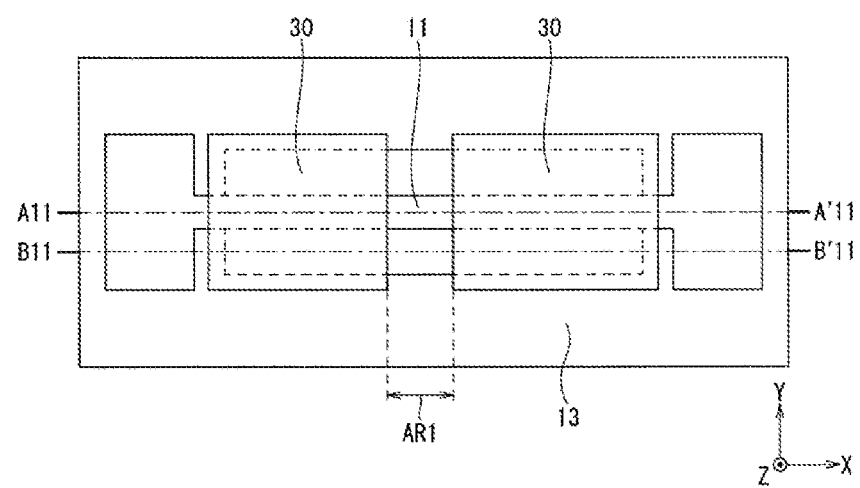
FIG. 11A is a diagram illustrating the manufacturing method of the semiconductor device according to the first embodiment of the present disclosure, in order of steps.
Figure 11B:
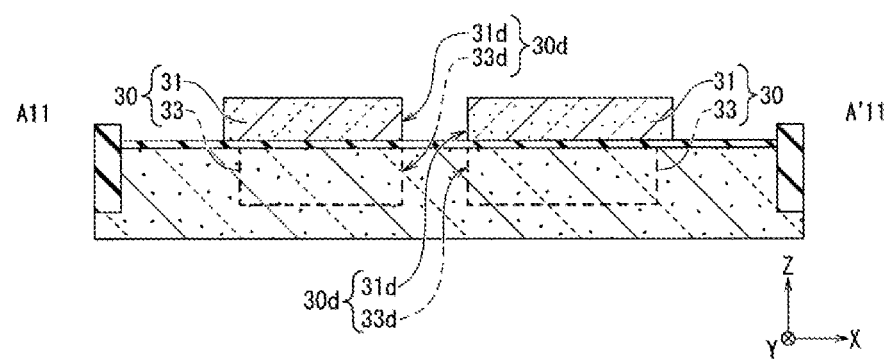
FIG. 11B is a diagram illustrating the manufacturing method of the semiconductor device according to the first embodiment of the present disclosure, in order of steps.
Figure 11C:
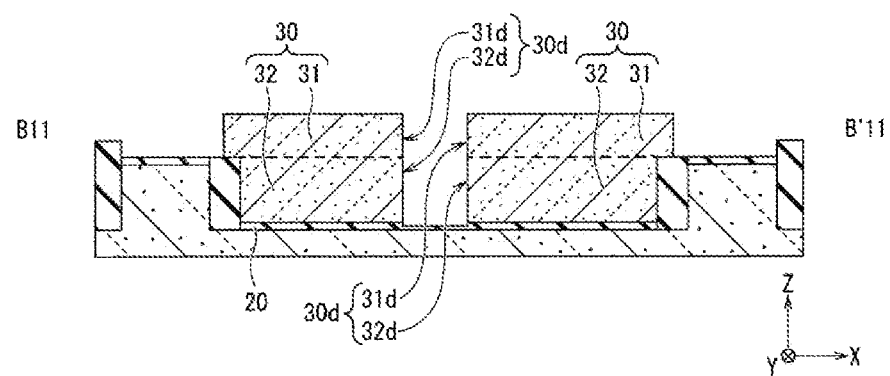
FIG. 11C is a diagram illustrating the manufacturing method of the semiconductor device according to the first embodiment of the present disclosure, in order of steps.

Next, using CVD, the manufacturing device forms a polysilicon film 30' (an example of an "electrode member" of the present disclosure) above the semiconductor substrate 10, and fills the trenches H1 and H2, as illustrated in FIGS. 10A to 10C. Next, the manufacturing device forms a resist pattern (not shown) on the polysilicon film 30'. The resist pattern has a shape that covers the region where the gate electrode is formed, but is open in the rest of the regions. Next, the manufacturing device removes the polysilicon film 30' through etching, using the resist pattern as a mask. Through this, the manufacturing device forms the gate electrode 30, as illustrated in FIGS. 11A to 11C.

In the step of etching for forming the gate electrode 30, the gate electrodes 30 are separated from each other by over-etching the polysilicon film 30' to a sufficient degree. The top face 11a, the first side face 11b, and the second side face 11c of the semiconductor region 11 are covered by the gate insulating film 20, and thus in a region AR1 where the polysilicon film 30' is over-etched, the semiconductor region 11 remains, without being etched. The manufacturing device then removes the resist pattern.

Figure 12A:
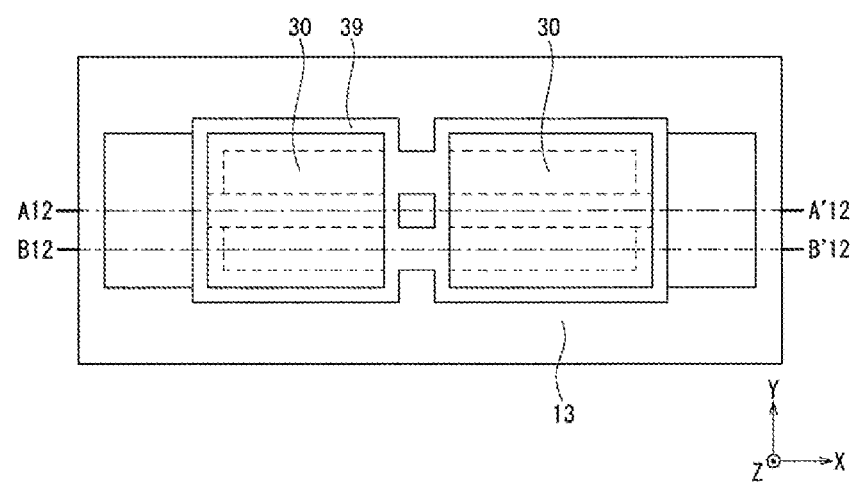
FIG. 12A is a diagram illustrating the manufacturing method of the semiconductor device according to the first embodiment of the present disclosure, in order of steps.
Figure 12B:
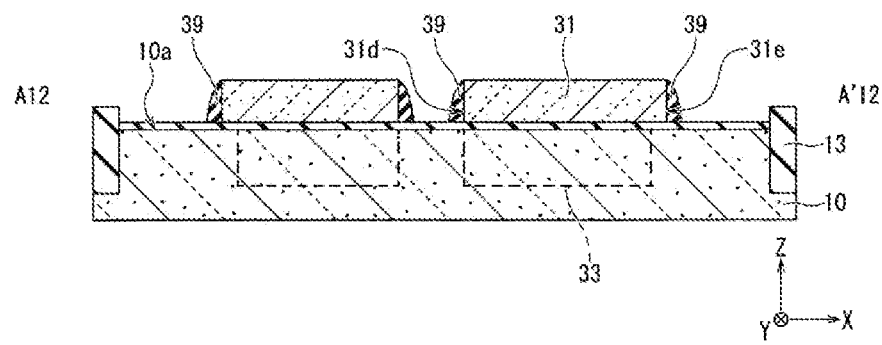
FIG. 12B is a diagram illustrating the manufacturing method of the semiconductor device according to the first embodiment of the present disclosure, in order of steps.
Figure 12C:
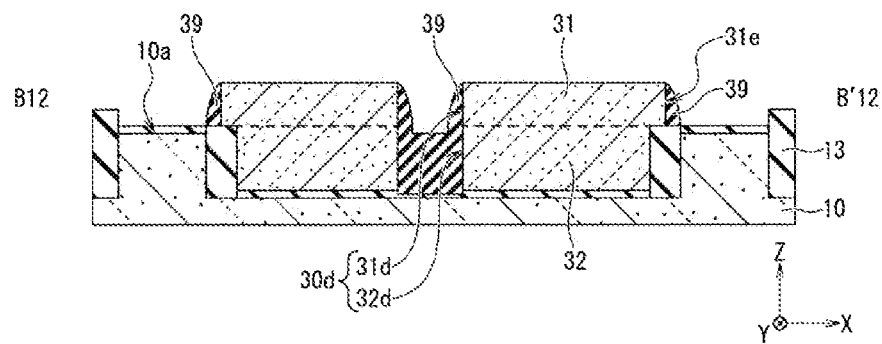
FIG. 12C is a diagram illustrating the manufacturing method of the semiconductor device according to the first embodiment of the present disclosure, in order of steps.

Next, the manufacturing device forms a silicon nitride film above the semiconductor substrate 10. Next, the manufacturing device etches back the silicon nitride film. Through this, the manufacturing device forms the sidewall 39 around the gate electrode 30, as illustrated in FIGS. 12A to 12C.

Next, the manufacturing device ion-implants the front surface 10a side of the semiconductor substrate 10 with an impurity of the first conductivity type, using the gate electrode 30 and the sidewall 39 as a mask. The manufacturing device then performs annealing on the semiconductor substrate 10 which has been ion-implanted with the impurity, and activates the impurity. Through this, the manufacturing device forms the impurity diffusion layers 41 and 42 which serve as the source region or the drain region (see FIGS. 4A and 4B) on the front surface 10a side of the semiconductor substrate 10.

The semiconductor device 100 having the grooved-gate structure MOS transistors 1A and 1B is completed through the foregoing steps.

As described thus far, the semiconductor device 100 according to the first embodiment of the present disclosure includes the semiconductor substrate 10, and the MOS transistors 1A and 1B provided on the front surface 10a side of the semiconductor substrate 10. The MOS transistors 1A and 1B include the semiconductor region 11 in which a channel is formed, the gate electrode 30 covering the semiconductor region 11, and the gate insulating film 20 disposed between the semiconductor region 11 and the gate electrode 30. The semiconductor region 11 has the top face 11a, and the first side face 11b located on one side of the top face 11a in the gate width direction of the gate electrode 30 (e.g., the Y-axis direction). The gate electrode 30 has the first part 31 facing the top face 11a over the gate insulating film 20, and the second part 32 facing the first side face 11b over the gate insulating film 20. The end face 31d of the first part 31 and the end face 32d of the second part 32 are flush at one end of the gate electrode 30 in the gate length direction (e.g., the X-axis direction).

Through this, the position of the end face 31d of the first part 31 and the position of the end face 32d of the second part 32 are aligned at one end in the X-axis direction. Through this, the semiconductor device 100 can suppress variations in the distance between the drain region (or source region) formed using the first part 31 as a mask and the second part 32. For example, the semiconductor device 100 can suppress variations in the distance between the impurity diffusion layer 42, which serves as the drain region, and the second part 32 of the gate electrode 30, in the MOS transistor 1A. Through this, the semiconductor device 100 can suppress variations in the transistor characteristics such as the gate-drain capacitance (Cgd).

Additionally, the semiconductor region 11 further has the second side face 11c, which is located at the other side of the top face 11a in the Y-axis direction. The gate electrode 30 further has the third part 33 which faces the second side face 11c over the gate insulating film 20. The end face 31d of the first part 31 and the end face 33d of the third part 33 are flush at one end of the gate electrode 30 in the X-axis direction.

Through this, the position of the end face 31d of the first part 31 and the position of the end face 33d of the third part 33 are aligned at one end in the X-axis direction. Through this, the semiconductor device 100 can suppress variations in the distance between the drain region (or source region) formed using the first part 31 as a mask and the third part 33. Through this, the semiconductor device 100 can further suppress variations in the transistor characteristics such as the Cgd.

A manufacturing method of the semiconductor device 100 according to the first embodiment of the present disclosure is a manufacturing method of a semiconductor device including the MOS transistors 1A and 1B on the front surface 10a side of the semiconductor substrate 10, and includes: forming the trench H1 by etching the front surface 10a of the semiconductor substrate 10; forming the gate insulating film 20 on the top face 11a of the semiconductor region 11 adjacent to the trench H1 and the first side face 11b facing the trench H1 in the semiconductor region 11; filling the trench H1 by forming the polysilicon film 30' on the front surface 10a side on which the gate insulating film 20 is formed; and forming the gate electrode 30 by etching the polysilicon film 30'. The gate electrode 30 has the first part 31 facing the top face 11a over the gate insulating film 20, and the second part 32 disposed in the trench H1 and facing the first side face 11b over the gate insulating film 20. In the forming of the gate electrode 30, the polysilicon film 30' is etched such that the end face 31d of the first part 31 and the end face 32d of the second part 32 are flush at one end of the gate electrode 30 in the X-axis direction.

Through this, the position of the end face 31d of the first part 31 and the position of the end face 32d of the second part 32 are aligned at one end in the X-axis direction. Through this, the manufacturing method can manufacture a semiconductor device in which variations in the distance between the drain region (or source region) and the second part 32 are suppressed, and variations in the transistor characteristics such as Cgd are suppressed.

The image capturing device 200 according to an embodiment of the present disclosure includes the photodiode PD, and the semiconductor device 100 for transmitting an electrical signal obtained through photoelectric conversion by the photodiode PD. The semiconductor device 100 can suppress variations in the transistor characteristics such as the Cgd. By using the MOS transistor 1A of the semiconductor device 100 as an amplifying transistor that amplifies electrical signals, the image capturing device 200 can suppress variations in charge conversion efficiency. Through this, the image capturing device 200 can improve image capturing performance, such as by reducing fixed pattern noise, for example.

Second Embodiment

The foregoing first embodiment described the end faces being flush at one end of the gate electrode 30 in the X-axis direction. However, the embodiments of the present disclosure are not limited thereto. In an embodiment of the present disclosure, the end faces may be flush not only at one end of the gate electrode 30, but at the other end as well. In other words, the respective end faces may be flush at both ends of the gate electrode 30 in the X-axis direction.

Figure 13A:
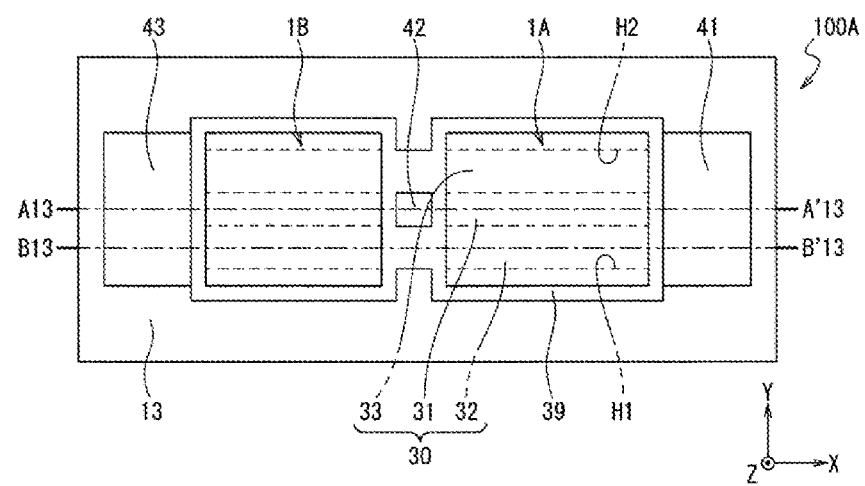
FIG. 13A is a plan view illustrating an example of the configuration of a semiconductor device according to a second embodiment of the present disclosure.
Figure 13B:
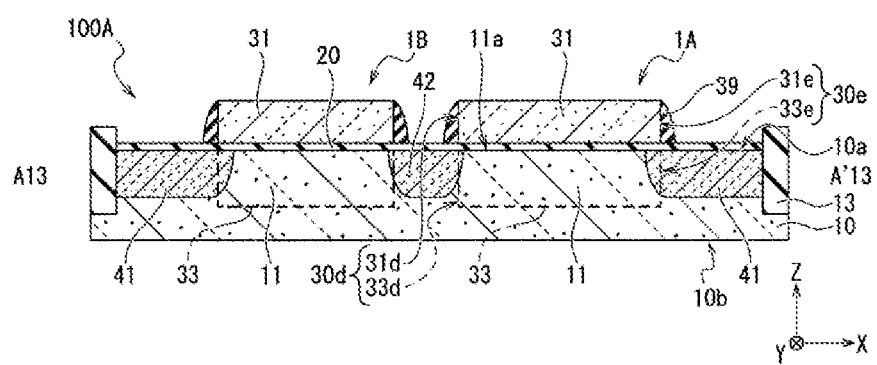
FIG. 13B is a cross-sectional view illustrating an example of the configuration of the semiconductor device according to the second embodiment of the present disclosure.
Figure 13C:
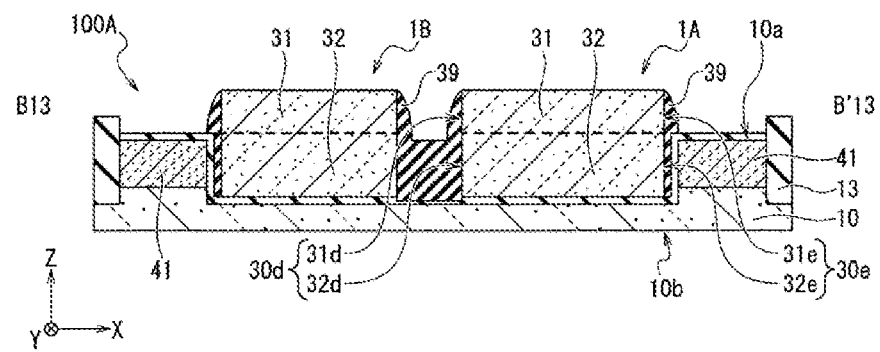
FIG. 13C is a cross-sectional view illustrating an example of the configuration of the semiconductor device according to the second embodiment of the present disclosure.

FIG. 13A is a plan view illustrating an example of the configuration of a semiconductor device 100A according to a second embodiment of the present disclosure. FIGS. 13B and 13C are cross-sectional views illustrating an example of the configuration of the semiconductor device 100A according to the second embodiment of the present disclosure. Specifically, FIG. 13B illustrates a cross-section of the plan view illustrated in FIG. 13A, cut along a line A13-A'13 parallel to the X-axis. FIG. 13C illustrates a cross-section of the plan view illustrated in FIG. 13A, cut along a line B13-B'13 parallel to the X-axis.

As illustrated in FIGS. 13A and 13B, the semiconductor device 100A according to the second embodiment includes the MOS transistors 1A and 1B. In each of the MOS transistors 1A and 1B, the gate electrode 30 has the end face 30d at one end in the X-axis direction, and the end face 30e at the other end in the X-axis direction. The end face 30d includes the end face 31d of the first part 31 (an example of a "first end face" of the present disclosure), the end face 32d of the second part 32 (an example of a "second end face" of the present disclosure), and the end face 33d of the third part 33 (an example of a "third end face" of the present disclosure). The end face 30e includes the end face 31e of the first part 31 (another example of a "first end face" of the present disclosure), the end face 32e of the second part 32 (another example of a "second end face" of the present disclosure), and the end face 33e of the third part 33 (another example of a "third end face" of the present disclosure).

In the semiconductor device 100A, there are no steps (or almost no steps) between the end face 31d and the end face 32d and between the end face 31d and the end face 33d. The end faces 31d, 32d, and 33d are flush. Likewise, there are also no steps (or almost no steps) between the end face 32e and the end face 31e and between the end face 31e and the end face 33e. The end faces 31e, 32e, and 33e are flush. In other words, the respective end faces at both ends of the gate electrode 30 in the X-axis direction are flush.

Through such a configuration, the semiconductor device 100A provides the same effects as the semiconductor device 100 according to the first embodiment. Additionally, with the semiconductor device 100A, the position of the end face 31e of the first part 31, the position of the end face 32e of the second part 32, and the position of the end face 33e of the third part 33 are aligned at the other end in the X-axis direction as well. Through this, the semiconductor device 100 can suppress variations in both the gate-drain capacitance (Cgd) and variations in the gate-source capacitance (Cgs) in each of the MOS transistors 1A and 1B.

A manufacturing method of the semiconductor device 100A will be described next. FIGS. 14A to 15B are cross-sectional views illustrating a manufacturing method of the semiconductor device 100A according to the second embodiment of the present disclosure, in order of steps. In FIGS. 14A to 15B, "A" in each drawing illustrates manufacturing steps for the cross-section illustrated in FIG. 13B, and "B" in each drawing illustrates manufacturing steps for the cross-section illustrated in FIG. 13C. Note that the manufacturing method of the semiconductor device 100A is the same as the manufacturing method of the semiconductor device 100 described in the first embodiment up to the step of forming the polysilicon film 30', illustrated in FIGS. 10A to 10C.

Figure 14A:
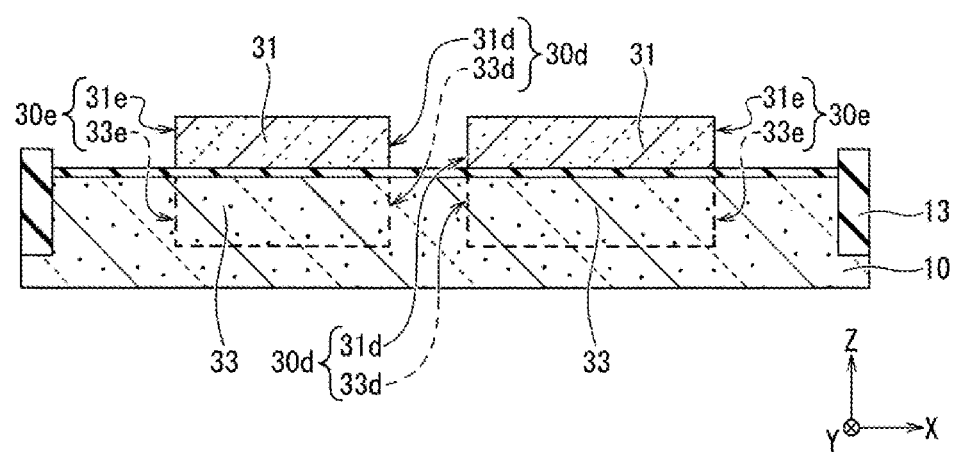
FIG. 14A is a cross-sectional view illustrating a manufacturing method of the semiconductor device according to the second embodiment of the present disclosure, in order of steps.
Figure 14B:
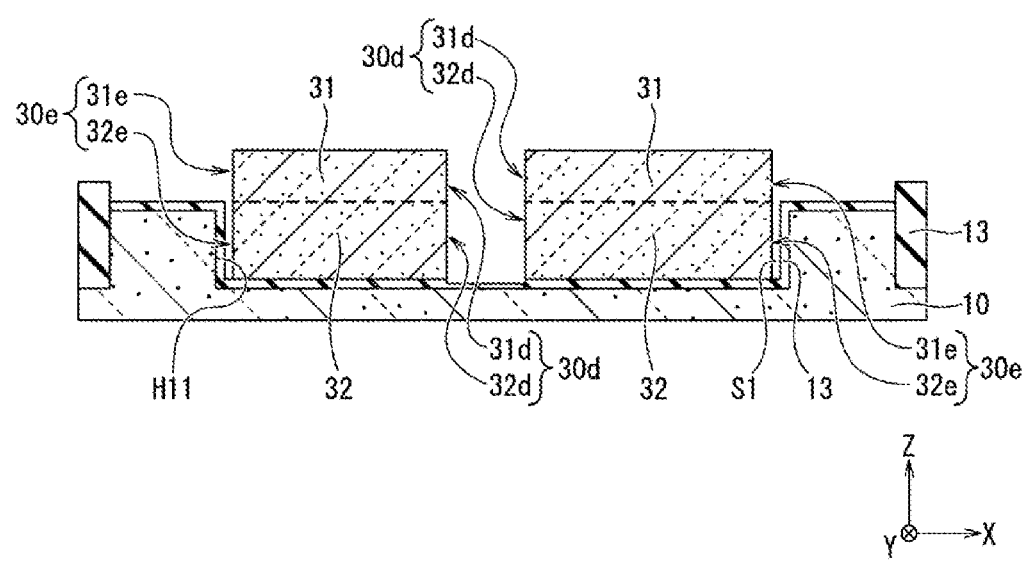
FIG. 14B is a cross-sectional view illustrating a manufacturing method of the semiconductor device according to the second embodiment of the present disclosure, in order of steps.

After the polysilicon film 30' is formed, the manufacturing device forms a resist pattern (not shown) on the polysilicon film 30'. The resist pattern has a shape that covers the region where the gate electrode is formed, but is open in the rest of the regions. Next, the manufacturing device removes the polysilicon film 30' through etching, using the resist pattern as a mask. Through this, the manufacturing device forms the gate electrode 30, as illustrated in FIGS. 14A and 14B. The manufacturing device then removes the resist pattern.

In the step of forming the gate electrode 30 illustrated in FIGS. 14A and 14B, the second part 32 and the third part 33 are etched, following the first part 31, not only at one end of the gate electrode 30 in the X-axis direction, but at the other end as well. Accordingly, the end faces 31e, 32e, and 33e are flush at the other end of the gate electrode 30. Additionally, a gap S1 is formed between the end faces 32e and 33e of the gate electrode 30 and the element separation layer 13 within the trench H11 as a result of the polysilicon film 30' being etched within the trench H11.

Figure 15A:
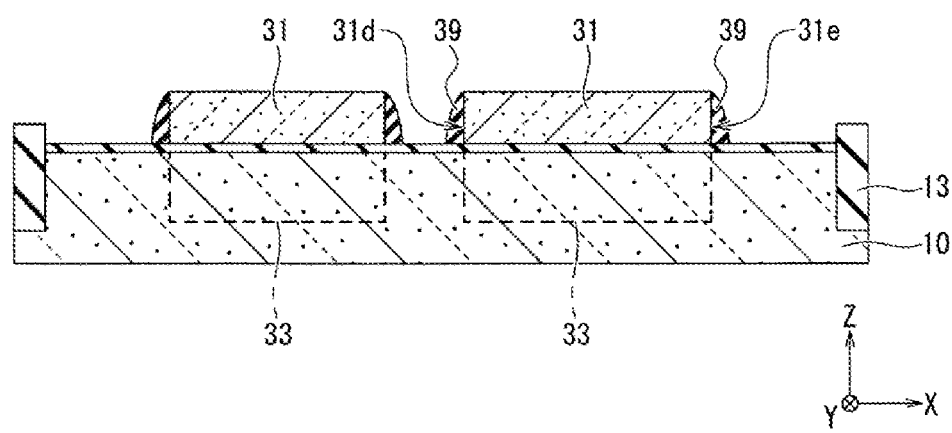
FIG. 15A is a cross-sectional view illustrating a manufacturing method of the semiconductor device according to the second embodiment of the present disclosure, in order of steps.
Figure 15B:
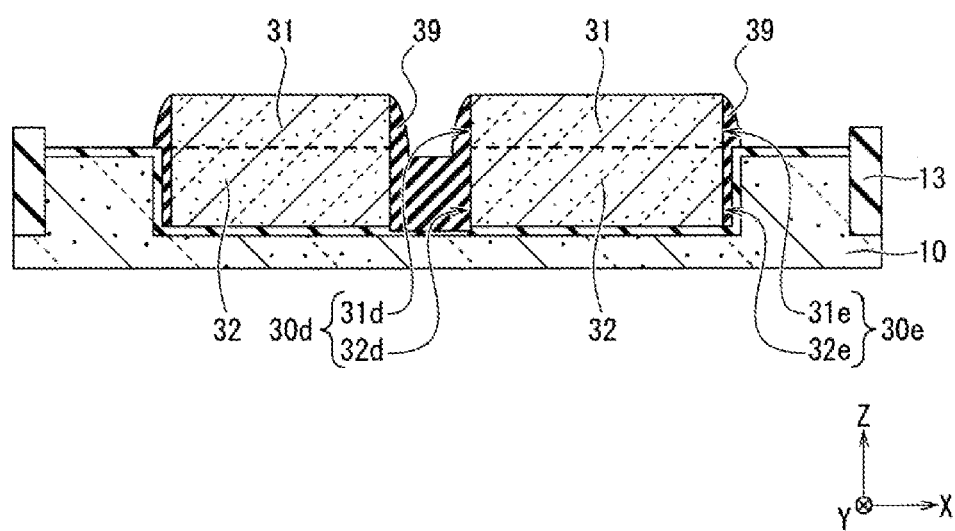
FIG. 15B is a cross-sectional view illustrating a manufacturing method of the semiconductor device according to the second embodiment of the present disclosure, in order of steps.

Next, the manufacturing device forms a silicon nitride film above the semiconductor substrate 10. The gap S1 is filled by the silicon nitride film. Next, the manufacturing device etches back the silicon nitride film. Through this, the manufacturing device forms the sidewall 39 around the gate electrode 30, as illustrated in FIGS. 15A and 15B. The semiconductor device 100A has a structure in which the end faces 32e and 33e facing the gap S1 are also covered by the sidewall 39.

In the manufacturing method of the semiconductor device 100A, the subsequent steps are the same as those in the manufacturing method of the semiconductor device 100 according to the first embodiment. The manufacturing device ion-implants an impurity using the gate electrode 30 and the sidewall 39 as a mask, and then performs annealing on the semiconductor substrate 10. Through this, the manufacturing device forms the impurity diffusion layers 41 and 42 which serve as the source region or the drain region (see FIGS. 13A and 13B). The semiconductor device 100A having the grooved-gate structure MOS transistors 1A and 1B is completed through the foregoing steps.

Third Embodiment

The foregoing first embodiment described the gate insulating film 20 as being constituted by an $SiO_2$ film and the gate electrode 30 as being constituted by a polysilicon film. However, in an embodiment of the present disclosure, the materials of the gate insulating film and the gate electrode are not limited thereto. For example, the gate insulating film may be constituted by a high dielectric constant film (a high-k insulating film) having a higher relative dielectric constant than $SiO_2$. Additionally, the gate electrode may be constituted by a metal material. An insulating film formed by thermally oxidizing the semiconductor substrate ("thermal oxide film" hereinafter) may be disposed between the high dielectric constant film and the semiconductor substrate.

Figure 16A:
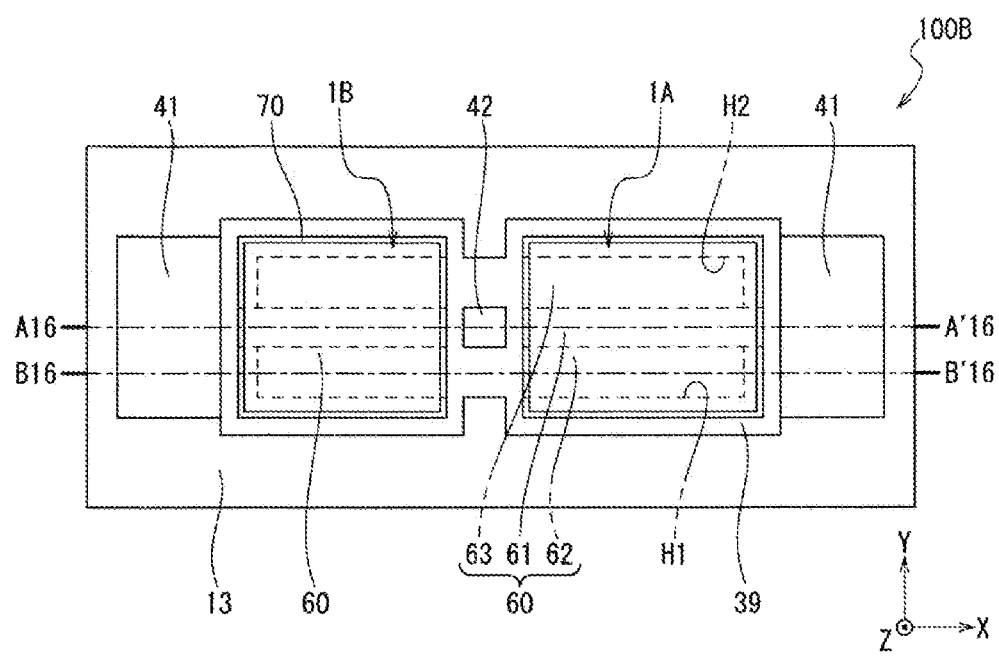
FIG. 16A is a plan view illustrating an example of the configuration of a semiconductor device according to a third embodiment of the present disclosure.
Figure 16B:
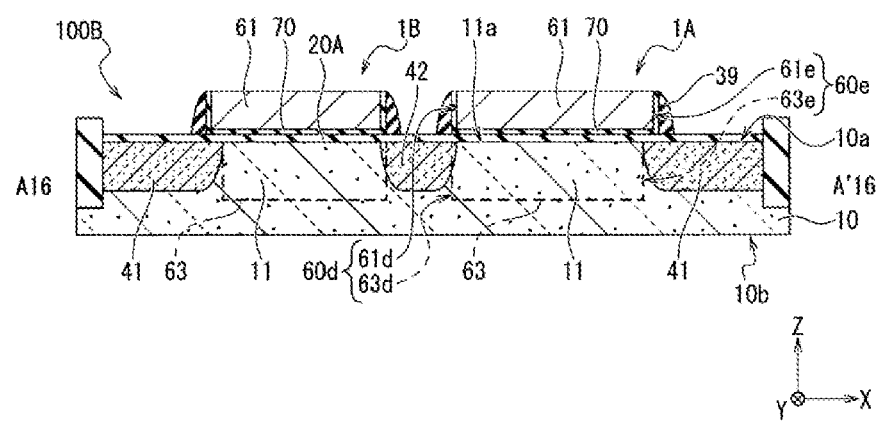
FIG. 16B is a cross-sectional view illustrating an example of the configuration of the semiconductor device according to the third embodiment of the present disclosure.
Figure 16C:
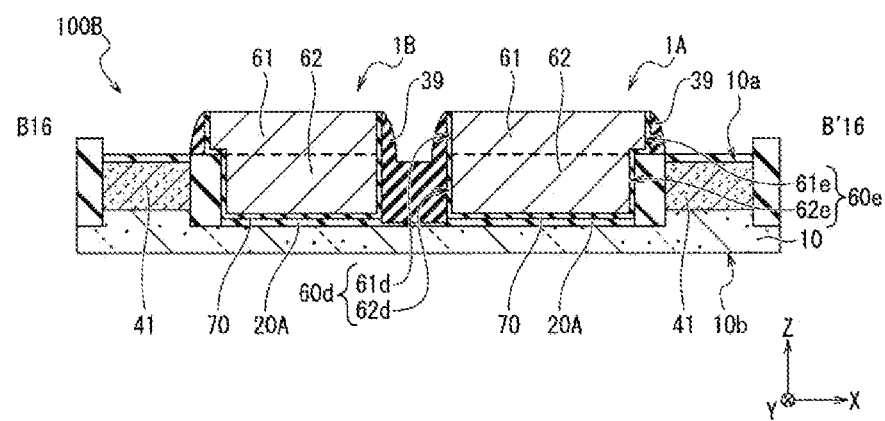
FIG. 16C is a cross-sectional view illustrating an example of the configuration of the semiconductor device according to the third embodiment of the present disclosure.

FIG. 16A is a plan view illustrating an example of the configuration of a semiconductor device 100B according to a third embodiment of the present disclosure. FIGS. 16B to 16D are cross-sectional views illustrating an example of the configuration of the semiconductor device 100B according to the third embodiment of the present disclosure. Specifically, FIG. 16B illustrates a cross-section of the plan view illustrated in FIG. 16A, cut along a line A16-A16 parallel to the X-axis. FIG. 16C illustrates a cross-section of the plan view illustrated in FIG. 16A, cut along a line B16-B'16 parallel to the X-axis. FIG. 16D illustrates a cross-section of the plan view illustrated in FIG. 16A, cut along a line C16-C'16 parallel to the Y-axis.

As illustrated in FIGS. 16A to 16D, the semiconductor device 100B according to the third embodiment includes the MOS transistors 1A and 1B. Each of the MOS transistors 1A and 1B has a high dielectric constant film 70 as the gate insulating film. The high dielectric constant film 70 is constituted by, for example, hafnium oxide or the like.

Additionally, each of the MOS transistors 1A and 1B has a metal gate 60 as the gate electrode. Like the gate electrode 30 described in the first embodiment, the metal gate 60 has a first part 61, which faces the top face 11a of the semiconductor region 11 over the high dielectric constant film 70; a second part 62, which faces the first side face 11b (see FIG. 4D) of the semiconductor region 11 over the high dielectric constant film 70; and a third part 63, which faces the second side face 11c (see FIG. 4D) of the semiconductor region 11 over the high dielectric constant film 70. The second part 62 and the third part 63 are connected to a bottom face of the first part 61. The metal gate 60 is constituted by, for example, titanium nitride, tungsten, or the like.

Although FIGS. 16B and 16C illustrate an example in which a thermal oxide film 20A (e.g., an SiO$_2$ film) is disposed between the semiconductor substrate 10 and the high dielectric constant film 70, this is merely an example. The thermal oxide film 20A need not be disposed between the semiconductor substrate 10 and the high dielectric constant film 70.

In each of the MOS transistors 1A and 1B, the metal gate 60 has an end face 60d at one end in the X-axis direction (e.g., the impurity diffusion layer 42 side), and an end face 60e at the other end in the X-axis direction (e.g., the impurity diffusion layer 41 side). The end face 60d includes an end face 61d of the first part 61 (an example of a "first end face" of the present disclosure), an end face 62d of the second part 62 (an example of a "second end face" of the present disclosure), and an end face 63d of the third part 63 (an example of a "third end face" of the present disclosure). The end face 60e includes an end face 61e of the first part 61, an end face 62e of the second part 62, and an end face 63e of the third part 63.

In the semiconductor device 100B according to the third embodiment, there are no steps (or almost no steps) between the end face 61d and the end face 62d and between the end face 61d and the end face 63d. The end faces 61d, 62d, and 63d are flush.

Even with such a configuration, the semiconductor device 100B provides the same effects as the semiconductor device 100 according to the first embodiment. Additionally, using the high dielectric constant film 70 for the gate insulating film makes it possible to increase the gate capacitances of the MOS transistors 1A and 1B, which in turn makes it possible to increase the thickness of the gate insulating film without a loss of gate capacitance.

A manufacturing method of the semiconductor device 100B will be described next. FIGS. 17A to 22B are cross-sectional views illustrating a manufacturing method of the semiconductor device 100B according to the third embodiment of the present disclosure, in order of steps. In FIGS. 17A to 22B, "A" in each drawing illustrates manufacturing steps for the cross-section illustrated in FIG. 16B, and "B" in each drawing illustrates manufacturing steps for the cross-section illustrated in FIG. 16C. Note that the manufacturing method of the semiconductor device 100B is the same as the manufacturing method of the semiconductor device 100 described in the first embodiment up to the step of forming a sacrificial gate electrode 30A. Note that the shape and size of the sacrificial gate electrode 30A are the same as those of the gate electrode 30 described in the first embodiment, for example. The sacrificial gate electrode 30A can be formed through the same method as the gate electrode 30. The thermal oxide film 20A can be formed through the same method as the gate insulating film 20 described in the first embodiment.

Figure 17A:
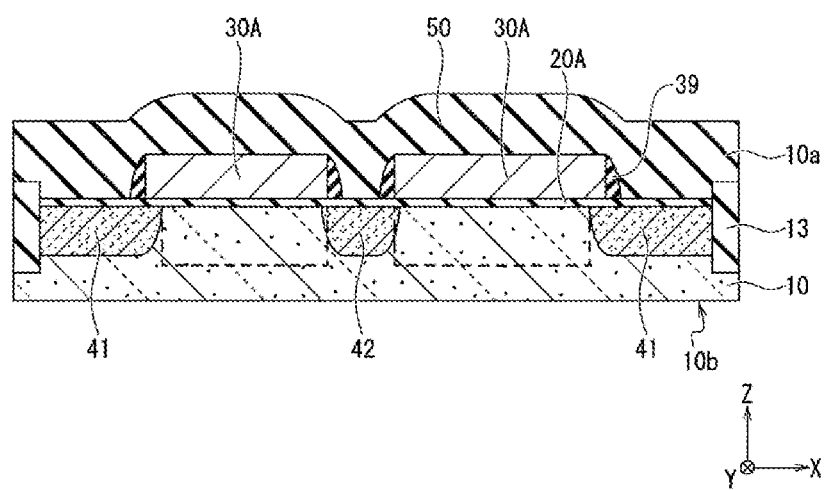
FIG. 17A is a cross-sectional view illustrating a manufacturing method of the semiconductor device according to the third embodiment of the present disclosure, in order of steps.
Figure 17B:
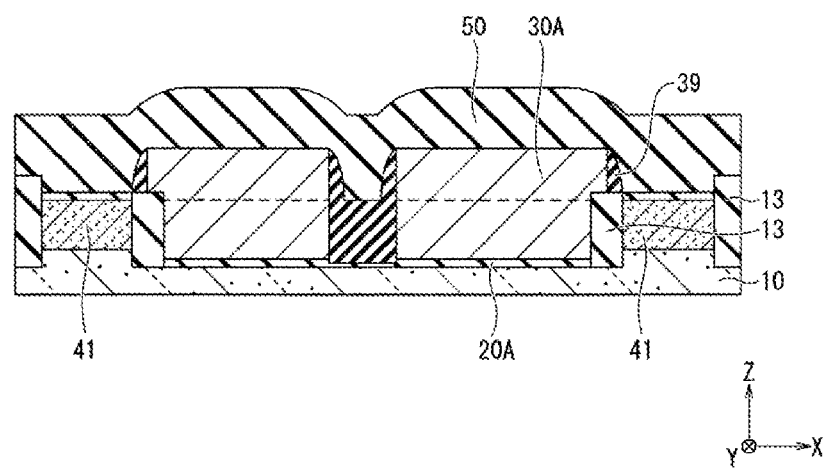
FIG. 17B is a cross-sectional view illustrating a manufacturing method of the semiconductor device according to the third embodiment of the present disclosure, in order of steps.
Figure 18A:
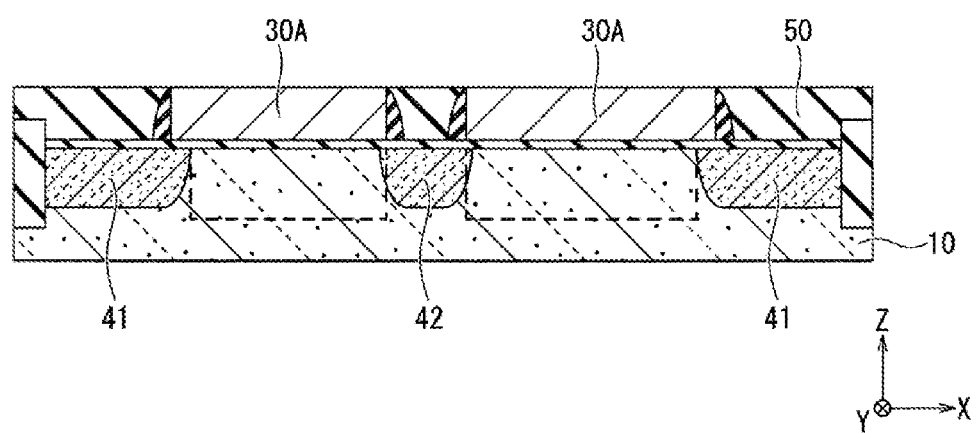
FIG. 18A is a cross-sectional view illustrating a manufacturing method of the semiconductor device according to the third embodiment of the present disclosure, in order of steps.
Figure 18B:
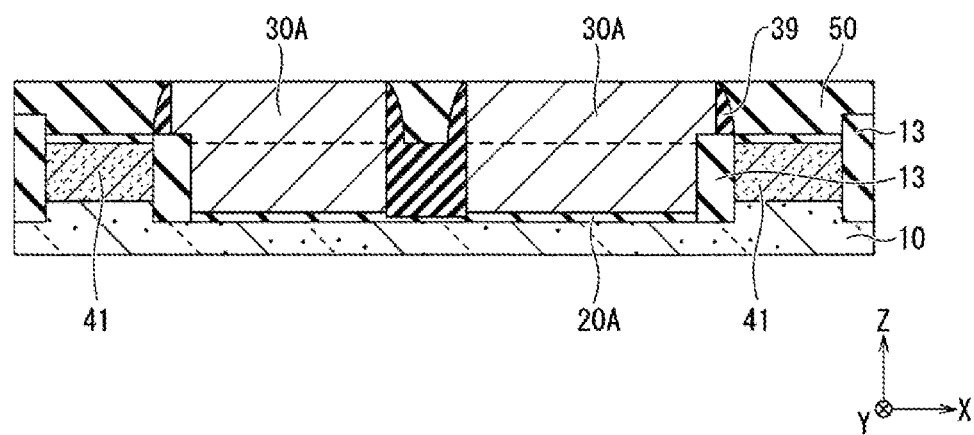
FIG. 18B is a cross-sectional view illustrating a manufacturing method of the semiconductor device according to the third embodiment of the present disclosure, in order of steps.

As illustrated in FIGS. 17A and 17B, after the sacrificial gate electrode 30A is formed, the manufacturing device forms a silicon oxide film (SiO$_2$) film 50 on the entire top surface of the semiconductor substrate 10 through CVD. The sacrificial gate electrode 30A is covered by the silicon oxide film 50. Next, as illustrated in FIGS. 18A and 18B, the manufacturing device exposes a surface of the sacrificial gate electrode 30A by performing CMP processing on the silicon oxide film 50. In the CMP processing, the sacrificial gate electrode 30A functions as a polishing stop layer.

Figure 19A:
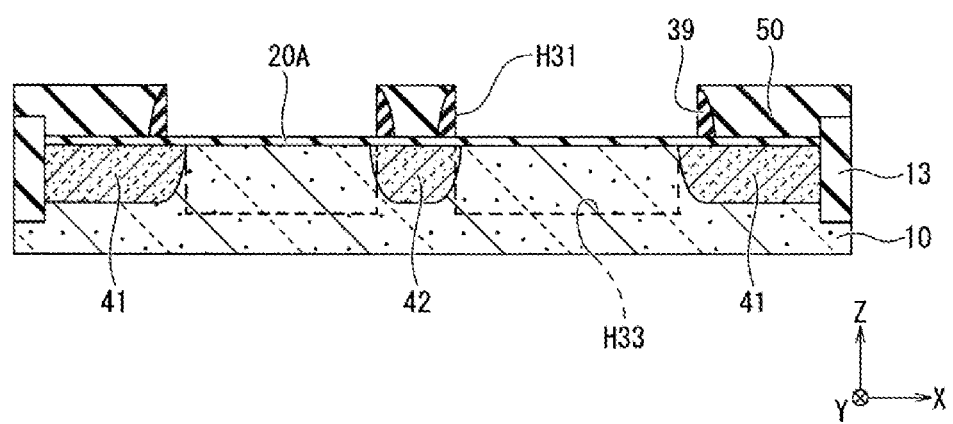
FIG. 19A is a cross-sectional view illustrating a manufacturing method of the semiconductor device according to the third embodiment of the present disclosure, in order of steps.
Figure 19B:
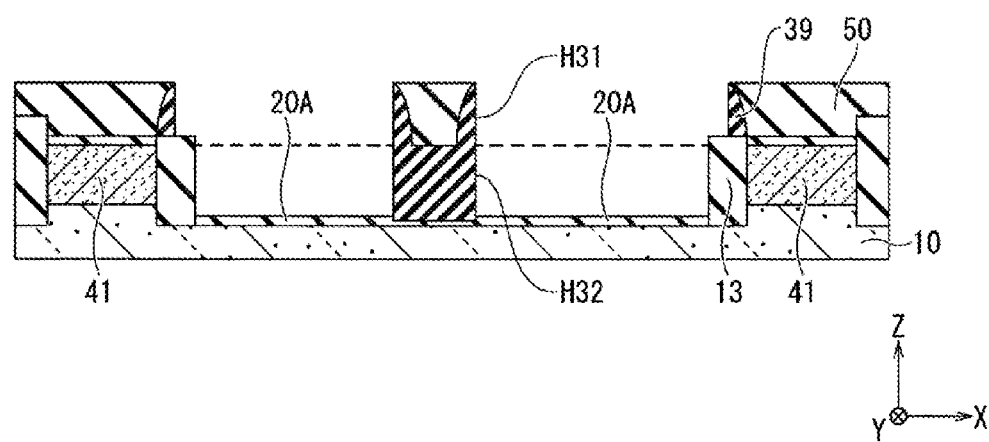
FIG. 19B is a cross-sectional view illustrating a manufacturing method of the semiconductor device according to the third embodiment of the present disclosure, in order of steps.

Next, the manufacturing device removes the sacrificial gate electrode 30A through etching. The sacrificial gate electrode 30A is constituted by, for example, polysilicon film. For the silicon oxide film and the silicon nitride film, the manufacturing device etches the sacrificial gate electrode 30A using process conditions which make it sufficiently easy for the polysilicon film to be etched (i.e., providing high etching selectivity). Once the sacrificial gate electrode 30A is removed, trenches H31 to H33 appear, as illustrated in FIGS. 19A and 19B. The trenches H31, H32, and H33 have the same shape as the first part 31, the second part 32, and the third part 33, respectively (see FIGS. 4A to 4D).

Figure 20A:
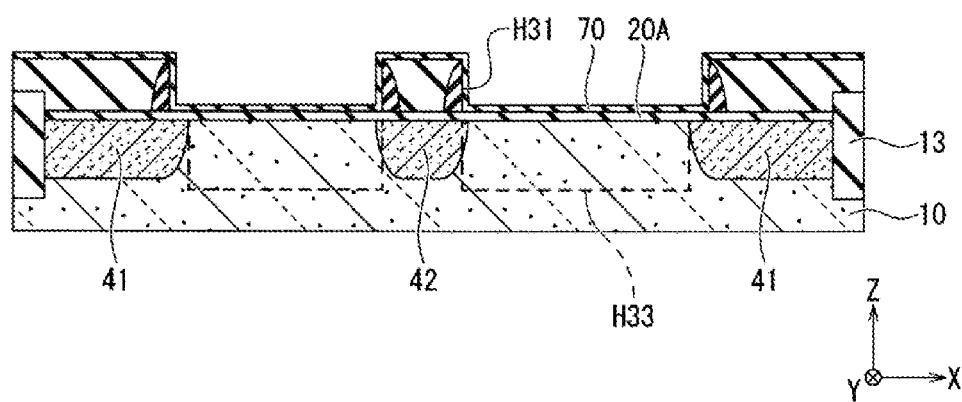
FIG. 20A is a cross-sectional view illustrating a manufacturing method of the semiconductor device according to the third embodiment of the present disclosure, in order of steps.
Figure 20B:
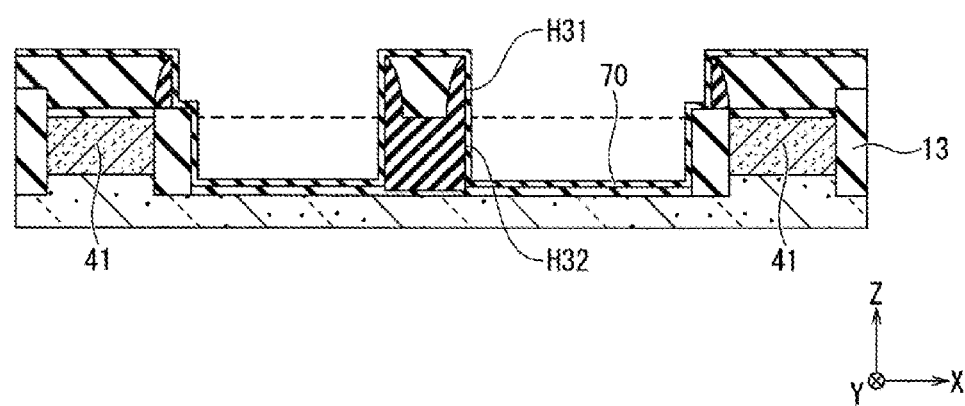
FIG. 20B is a cross-sectional view illustrating a manufacturing method of the semiconductor device according to the third embodiment of the present disclosure, in order of steps.

Next, as illustrated in FIGS. 20A and 20B, the manufacturing device forms the high dielectric constant film 70 on the entire top surface of the semiconductor substrate 10. The inside surfaces and the bottom surfaces of the trenches H31, H32, and H33 are covered by the high dielectric constant film 70.

Figure 21A:
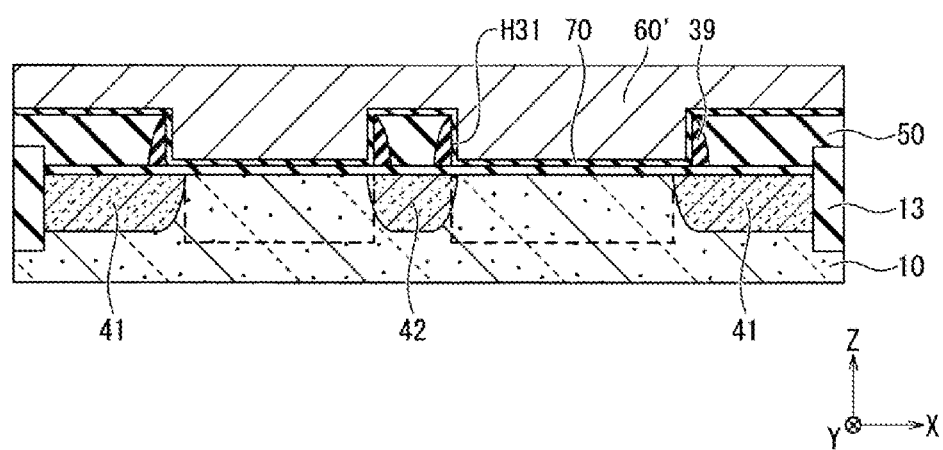
FIG. 21A is a cross-sectional view illustrating a manufacturing method of the semiconductor device according to the third embodiment of the present disclosure, in order of steps.
Figure 21B:
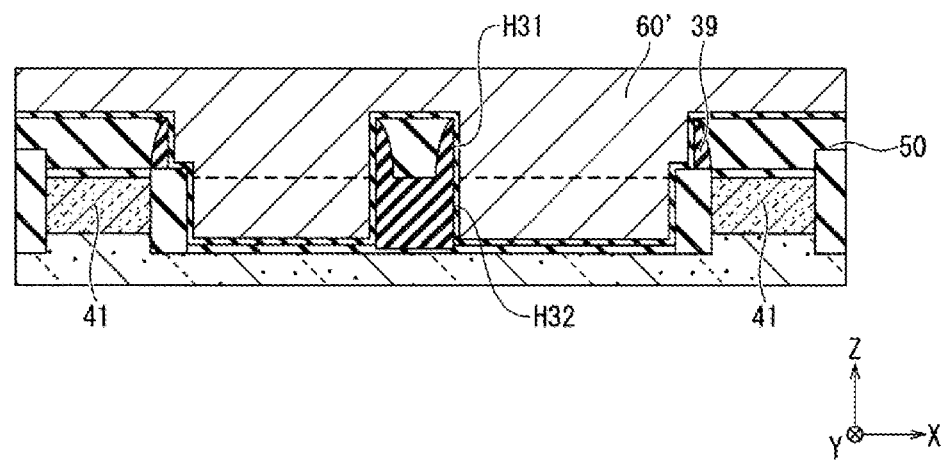
FIG. 21B is a cross-sectional view illustrating a manufacturing method of the semiconductor device according to the third embodiment of the present disclosure, in order of steps.

Next, as illustrated in FIGS. 21A and 21B, the manufacturing device forms a metal film 60' on the entire top surface of the semiconductor substrate 10. The metal film 60' is constituted by tungsten, for example. The metal film 60' is formed through CVD, for example. The trenches H31, H32, and H33 are filled by the metal film 60'.

Figure 22A:
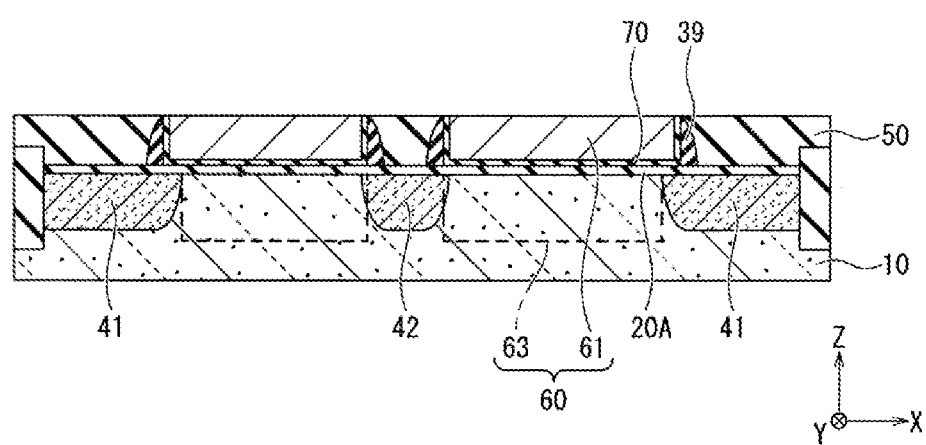
FIG. 22A is a cross-sectional view illustrating a manufacturing method of the semiconductor device according to the third embodiment of the present disclosure, in order of steps.
Figure 22B:
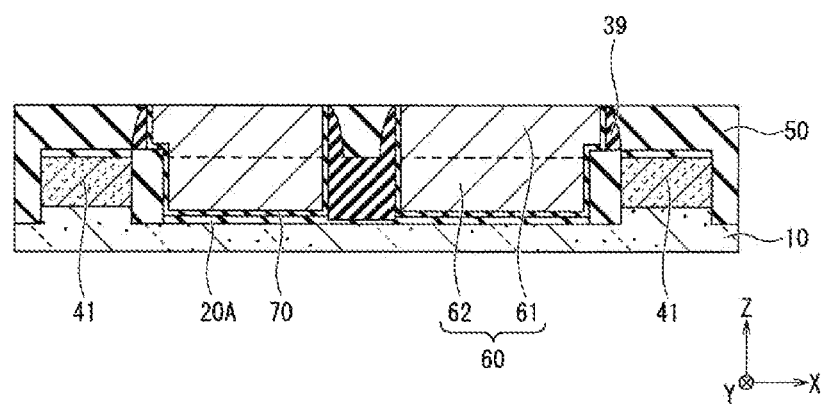
FIG. 22B is a cross-sectional view illustrating a manufacturing method of the semiconductor device according to the third embodiment of the present disclosure, in order of steps.

Next, as illustrated in FIGS. 22A and 22B, the manufacturing device exposes a surface of the silicon oxide film 50 by performing CMP processing on the metal film 60'. In this CMP processing, the silicon oxide film 50 functions as a polishing stop layer. The metal gate 60 is formed from the metal film 60' through this CMP processing.

The semiconductor device 100B having the grooved-gate structure MOS transistors 1A and 1B is completed through the foregoing steps.

Other Embodiments

While the present disclosure has been described thus far in the form of embodiments and variations, the descriptions and drawings that constitute parts of the disclosure are not intended to be understood as limiting the present disclosure. That various alternative embodiments, examples, and operable techniques are possible will be clear to those skilled in the art from this disclosure. It goes without saying that the present technique includes various embodiments and the like not described herein. Various constituent elements can be omitted, replaced, and/or changed without departing from the essential spirit of the above-described embodiments and variations. Furthermore, the effects described in the present specification are merely exemplary and not intended to be limiting, and other effects may be provided as well.

Note that the present disclosure can also take on configurations such as those described below.

(1) A semiconductor device, comprising:
a semiconductor substrate; and
a field effect transistor provided on a first main surface side of the semiconductor substrate,
wherein the field effect transistor includes:
a semiconductor region in which a channel is formed;
a gate electrode covering the semiconductor region; and
a gate insulating film disposed between the semiconductor region and the gate electrode,
the semiconductor region includes:
a top face, and a first side face located at one side of the top face in a gate width direction of the gate electrode,
the gate electrode includes:
a first part facing the top face over the gate insulating film; and
a second part facing the first side face over the gate insulating film, and
a first end face of the first part and a second end face of the second part are flush at at least one end of the gate electrode in a gate length direction.

(2) The semiconductor device according to (1),
wherein the semiconductor region further includes:
a second side face located at another side of the top face in the gate width direction,
the gate electrode further includes:
a third part facing the second side face over the gate insulating film, and
the first end face and a third end face of the third part are flush at at least one end of the gate electrode in the gate length direction.

(3) The semiconductor device according to (2),
wherein the semiconductor substrate further includes:
a first trench provided on the first main surface side; and
a second trench provided on the first main surface adjacent to the first trench, with the semiconductor region between the first trench and the second trench, the second part is disposed in the first trench, and
the third part is disposed in the second trench.

(4) The semiconductor device according to any one of (1) to (3),
wherein the gate electrode is constituted by polysilicon.

(5) The semiconductor device according to any one of (1) to (3),
wherein the gate electrode is constituted by a metal.

(6) A manufacturing method of a semiconductor device including a field effect transistor on a first main surface of a semiconductor substrate, the manufacturing method comprising:
forming a first trench in a position adjacent to a semiconductor region by etching the first main surface side of the semiconductor substrate serving as a channel of the field effect transistor;
forming a gate insulating film on a top face of the semiconductor region and a first side face facing the first trench in the semiconductor region;
filling the first trench by forming an electrode member on the first main surface side on which the gate insulating film is formed; and
forming a gate electrode by etching the electrode member,
wherein the gate electrode includes:
a first part facing the top face over the gate insulating film; and
a second part disposed in the first trench and facing the first side face over the gate insulating film, and
in the forming of the gate electrode,
the electrode member is etched such that a first end face of the first part and a second end face of the second part are flush at at least one end of the gate electrode in the gate length direction.

(7) An image capturing device, comprising:
a photoelectric conversion element; and
a semiconductor device for transmitting an electrical signal obtained through photoelectric conversion by the photoelectric conversion element,
wherein the semiconductor device includes:
a semiconductor substrate; and
a field effect transistor provided on a first main surface side of the semiconductor substrate,
the field effect transistor includes:
a semiconductor region in which a channel is formed;
a gate electrode covering the semiconductor region; and
a gate insulating film disposed between the semiconductor region and the gate electrode,
the semiconductor region includes:
a top face, and a first side face located at one side of the top face in a gate width direction of the gate electrode,
the gate electrode includes:
a first part facing the top face over the gate insulating film; and
a second part facing the first side face over the gate insulating film, and
a first end face of the first part and a second end face of the second part are flush at at least one end of the gate electrode in a gate length direction.

REFERENCE SIGNS LIST 1A, 1B MOS transistor
10 Semiconductor substrate
10a Front surface
10b Rear surface
11 Semiconductor region
11a Top face
11b First side face
11c Second side face
13 Element separation layer
15, 50 Silicon oxide film
17 Silicon nitride film
20 Gate insulating film
20A Thermal oxide film
30 Gate electrode
30' Polysilicon film
30A Sacrificial gate electrode
30d, 30e, 31d, 31e, 32d, 32e, 33d, 33e, 61d, 61e, 62d, 62e, 63d, 63e End face
31, 61 First part
32, 62 Second part
33, 63 Third part
39 Sidewall 41, 42 Impurity diffusion layer
60 Metal gate
60' Metal film
70 High dielectric constant film
100, 100A, 100B Semiconductor device
150 Readout circuit
151 Current mirror circuit
152 Load MOS circuit
153R PMOS transistor
153S PMOS transistor
200 Image capturing device
211 Pixel array unit
212 Vertical driving unit
213 Circuit unit
214 Column signal processing unit
215 Horizontal driving unit
216 System control unit
217 Signal processing unit
218 Data holding unit
231 Pixel drive line
232 Vertical pixel wire
261 Vertical reset input line
261R Reference-side vertical reset input line
261S Readout-side vertical reset input line
262 Vertical current supply line
262R Reference-side vertical current supply line
262S Readout-side vertical current supply line
AMP Amplifying transistor
FD Floating diffusion region
H1, H2, H11, H31, H32, H33 Trench
PD Photodiode
PU Pixel
PUR Reference pixel
PUS Readout pixel
RP1 Resist pattern
RST Reset transistor
RST-L Driving line
S1 Gap
SEL Selecting transistor
SEL-L Driving line
TR Transfer transistor
TR-L Driving line
Vcom Connection point
Vout Output terminal
Vrst Power supply
VSL Vertical signal line
VSLR Reference-side vertical signal line
VSLS Readout-side vertical signal line

What is claimed is:

1. A semiconductor device, comprising:
a semiconductor substrate; and
a field effect transistor provided on a first main surface side of the semiconductor substrate,
wherein the field effect transistor includes:
  a semiconductor region in which a channel is formed;
  a gate electrode covering the semiconductor region; and
  a gate insulating film disposed between the semiconductor region and the gate electrode,
wherein the semiconductor region includes:
  a top face, and a first side face located at one side of the top face in a gate width direction of the gate electrode,
wherein the gate electrode includes:
  a first part facing the top face over the gate insulating film; and
  a second part facing the first side face over the gate insulating film,
wherein a first end face of the first part and a first end face of the second part are flush at a first end of the gate electrode in a gate length direction, and
wherein a second end face of the first part and a second end face of the second part are not flush at a second end of the gate electrode in the gate length direction.

2. The semiconductor device according to claim 1,
wherein the semiconductor region further includes:
  a second side face located at another side of the top face in the gate width direction,
wherein the gate electrode further includes:
  a third part facing the second side face over the gate insulating film, and
wherein a first end face of the third part is flush with the first end of the gate electrode in the gate length direction.

3. The semiconductor device according to claim 2,
wherein the semiconductor substrate further includes:
  a first trench provided on the first main surface side; and
  a second trench provided on the first main surface side adjacent to the first trench, with the semiconductor region between the first trench and the second trench,
wherein the second part is disposed in the first trench, and
wherein the third part is disposed in the second trench.

4. The semiconductor device according to claim 1,
wherein the gate electrode is constituted by polysilicon.

5. The semiconductor device according to claim 1,
wherein the gate electrode is constituted by a metal.

6. A manufacturing method of a semiconductor device including a field effect transistor on a first main surface side of a semiconductor substrate, the manufacturing method comprising:
  forming a first trench in a position adjacent to a semiconductor region by etching the first main surface side of the semiconductor substrate serving as a channel of the field effect transistor;
  forming a gate insulating film on a top face of the semiconductor region and a first side face facing the first trench in the semiconductor region;
  filling the first trench by forming an electrode member on the first main surface side on which the gate insulating film is formed; and
  forming a gate electrode by etching the electrode member,
wherein the gate electrode includes:
  a first part facing the top face over the gate insulating film; and
  a second part disposed in the first trench and facing the first side face over the gate insulating film, and
wherein in the forming of the gate electrode, the electrode member is etched such that a first end face of the first part and a second end face of the second part are flush at a first end of the gate electrode in a gate length direction, and a third end face of the first part and a fourth end face of the second part are not flush at a second end of the gate electrode in the gate length direction.

7. An image capturing device, comprising:
a photoelectric conversion element; and
a semiconductor device for transmitting an electrical signal obtained through photoelectric conversion by the photoelectric conversion element,
wherein the semiconductor device includes:
  a semiconductor substrate; and a field effect transistor provided on a first main surface side of the semiconductor substrate,
wherein the field effect transistor includes:
a semiconductor region in which a channel is formed;
a gate electrode covering the semiconductor region; and
a gate insulating film disposed between the semiconductor region and the gate electrode,
wherein the semiconductor region includes:
a top face, and a first side face located at one side of the top face in a gate width direction of the gate electrode,
wherein the gate electrode includes:
a first part facing the top face over the gate insulating film; and
a second part facing the first side face over the gate insulating film, and
wherein a first end face of the first part and a second end face of the second part are flush at a first end of the gate electrode in a gate length direction, and
wherein a third end face of the first part and a fourth end face of the second part are not flush at a second end of the gate electrode in the gate length direction.

* * * * *